(12) United States Patent
Wu

(10) Patent No.: US 11,903,331 B2
(45) Date of Patent: *Feb. 13, 2024

(54) DIGITAL CIRCUITS COMPRISING QUANTUM WIRE RESONANT TUNNELING TRANSISTORS

(71) Applicant: Koucheng Wu, Nantou County (TW)

(72) Inventor: Koucheng Wu, Nantou County (TW)

( * ) Notice: Subject to any disclaimer, the term of this patent is extended or adjusted under 35 U.S.C. 154(b) by 38 days.

This patent is subject to a terminal disclaimer.

(21) Appl. No.: 17/467,188

(22) Filed: Sep. 4, 2021

(65) Prior Publication Data

US 2021/0399198 A1  Dec. 23, 2021

Related U.S. Application Data

(63) Continuation-in-part of application No. 16/852,493, filed on Apr. 19, 2020, now Pat. No. 11,133,384.

(51) Int. Cl.

| | | |
|---|---|---|
| *H10N 60/10* | (2023.01) | |
| *H10N 60/01* | (2023.01) | |
| *H10N 69/00* | (2023.01) | |
| *H03K 19/20* | (2006.01) | |
| *H03K 19/088* | (2006.01) | |
| *H03K 19/00* | (2006.01) | |
| *H03K 19/082* | (2006.01) | |
| *H03K 17/60* | (2006.01) | |
| *H01L 29/04* | (2006.01) | |
| *H01L 29/66* | (2006.01) | |
| *H01L 29/76* | (2006.01) | |
| *H01L 29/15* | (2006.01) | |
| *H01L 29/775* | (2006.01) | |
| *H03K 17/92* | (2006.01) | |
| *H03K 19/195* | (2006.01) | |

(52) U.S. Cl.
CPC ......... *H10N 60/128* (2023.02); *H01L 29/045* (2013.01); *H01L 29/151* (2013.01); *H01L 29/66439* (2013.01); *H01L 29/66931* (2013.01); *H01L 29/7606* (2013.01); *H01L 29/775* (2013.01); *H03K 17/60* (2013.01); *H03K 17/92* (2013.01); *H03K 19/001* (2013.01); *H03K 19/082* (2013.01); *H03K 19/088* (2013.01); *H03K 19/195* (2013.01); *H03K 19/20* (2013.01); *H10N 60/0884* (2023.02); *H10N 69/00* (2023.02)

(58) Field of Classification Search
CPC ....................... H01L 29/66439; H01L 29/775; H01L 29/125
See application file for complete search history.

(56) References Cited

U.S. PATENT DOCUMENTS

| | | | | |
|---|---|---|---|---|
| 2008/0179586 A1* | 7/2008 | Kamins | ................... | H01L 29/73 977/932 |
| 2010/0102298 A1* | 4/2010 | Wu | ....................... | H01L 29/152 257/E29.078 |

\* cited by examiner

*Primary Examiner* — Syed I Gheyas

(57) ABSTRACT

A digital circuit includes at least one quantum wire resonant tunneling transistor that includes an emitter terminal, a base terminal, a collector terminal, an emitter region in connection with the emitter terminal, a base region in connection with the base terminal, a collector region in connection with the collector terminal, an emitter barrier region between the emitter region and the base region, and a collector barrier region between the collector region and the base region. At least one of the emitter region, the base region, and the collector region includes a plurality of metal quantum wires.

15 Claims, 12 Drawing Sheets

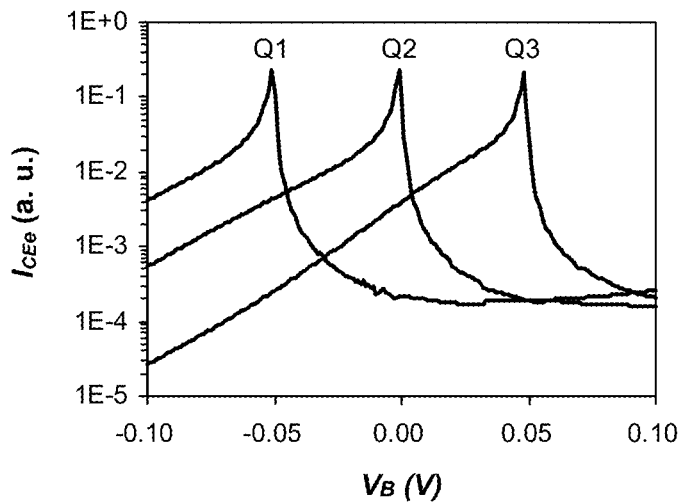
FIG. 9
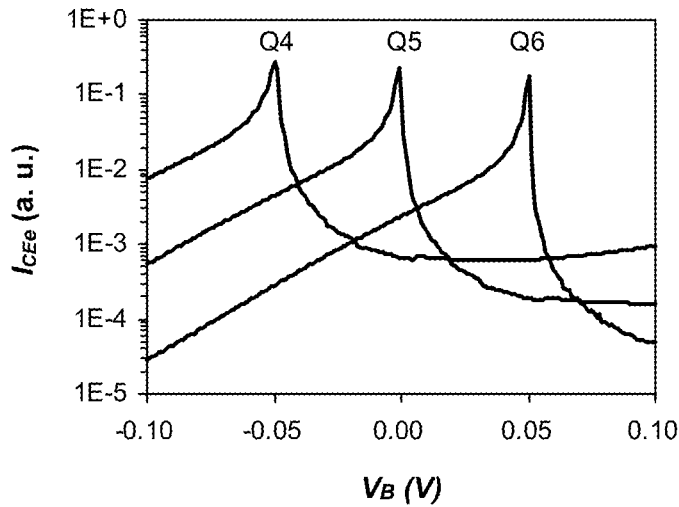
FIG. 10
| | normally on | enhancement-mode | |
|---|---|---|---|
| | $V_{ON} = 0$ | $V_{ON} > 0$ | $V_{ON} < 0$ |
| n-type | B—[ N ]—C,E | B—[ N+ ]—C,E | B—[ N- ]—C,E |
| p-type | B—[ P ]—C,E | B—[ P+ ]—C,E | B—[ P- ]—C,E |
FIG. 11

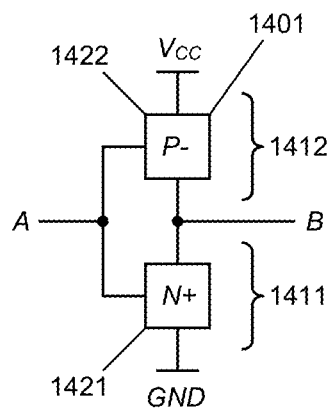
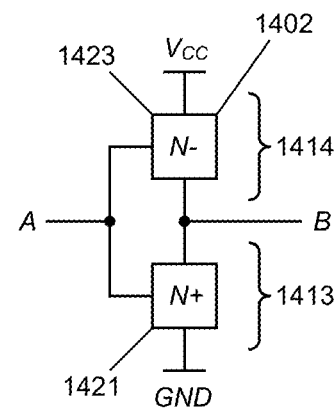
FIG. 14a              FIG. 14b
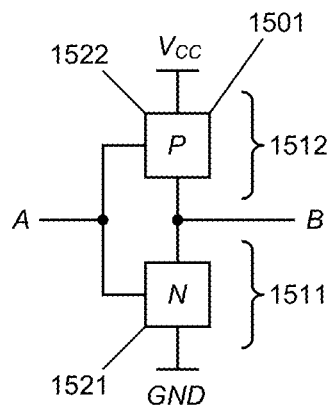
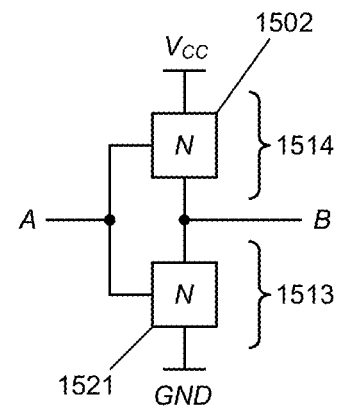
FIG. 15a              FIG. 15b
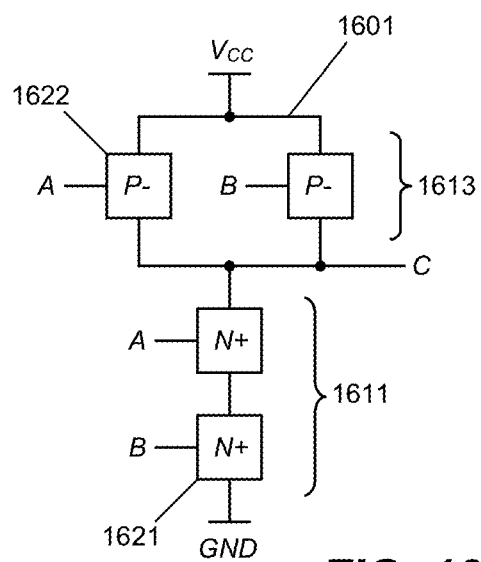
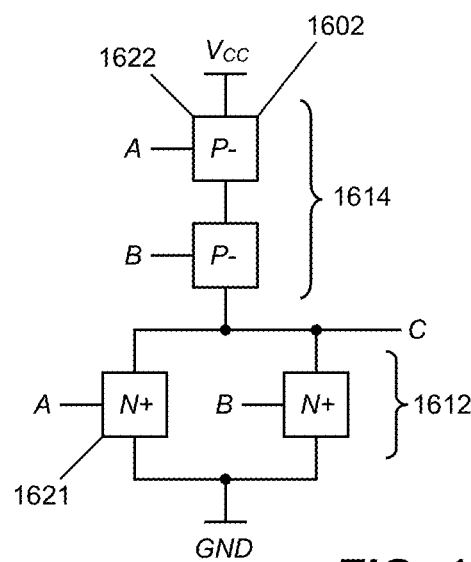
FIG. 16a              FIG. 16b

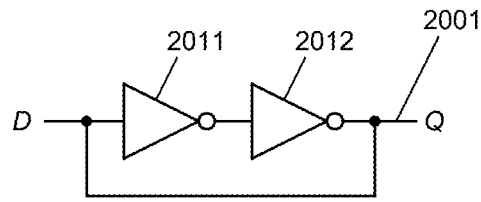
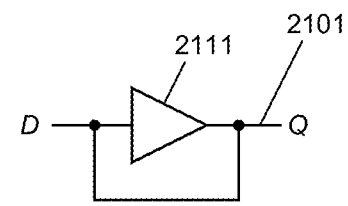
FIG. 20a                FIG. 21a
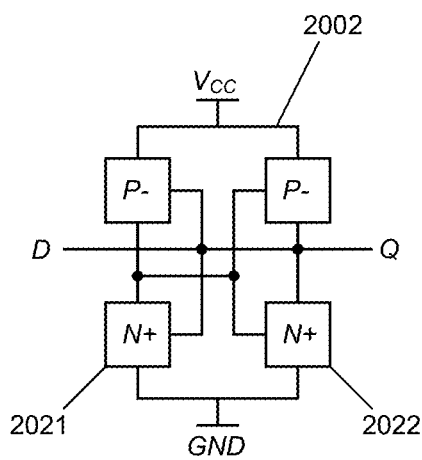
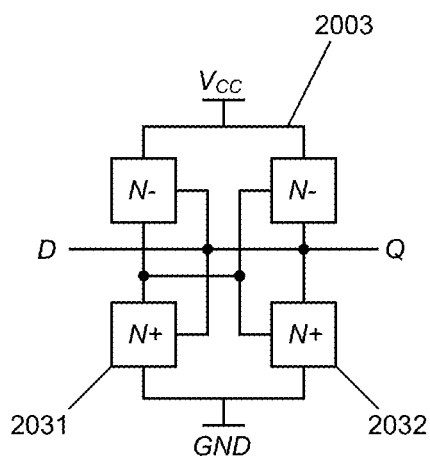
FIG. 20b                FIG. 20c
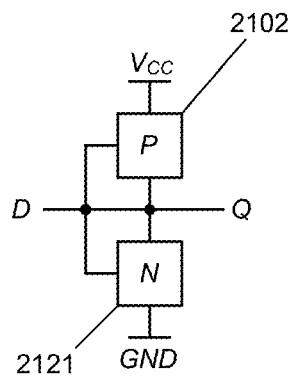
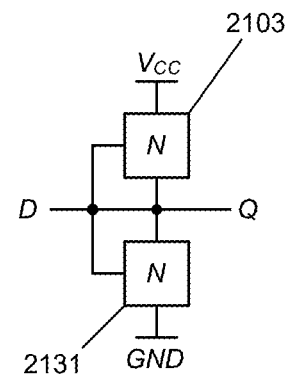
FIG. 21b                FIG. 21c

DIGITAL CIRCUITS COMPRISING QUANTUM WIRE RESONANT TUNNELING TRANSISTORS

CROSS-REFERENCE TO RELATED APPLICATIONS

The present application is a continuation-in-part application based on commonly assigned U.S. patent application Ser. No. 16/852,493, titled "Quantum Wire Resonant Tunneling Transistor", filed on Apr. 19, 2020 by the same inventor, the content of which is incorporated herein by reference.

TECHNICAL FIELD

This application relates generally to digital circuits, and more specifically to the digital circuits comprising Quantum Wire Resonant Tunneling Transistors.

BACKGROUND OF THE INVENTION

The MOSFET (Metal-Oxide-Semiconductor Field-Effect Transistor) is a fundamental building block of semiconductor technology. A large part of its success is due to the fact that it can be continuously scaled down to smaller dimensions while increasing circuit performance and lowering manufacturing cost. After more than 50 years of miniaturization, the benefits from device scaling have gradually diminished. MOS device scaling could stop in the near future according to 2015 International Technology Roadmap for Semiconductors (ITRS) (R. Courtland, "Transistors Could Stop Shrinking in 2021," *IEEE Spectrum*, vol. 53, no. 9, pp. 9-11, September 2016, doi: 10.1109/MSPEC.2016.7551335, and also International Technology Roadmap for Semiconductors, 2015 Edition, available: http://www.itrs2.net/). A low-cost and high-performance transistor beyond CMOS is in urgent need to meet the growing demand for computing power. Such a new transistor may bring new challenges to circuit design because the new transistor may have very different operating mechanisms and behaviors from the MOSFET.

SUMMARY OF INVENTION

In one general aspect, the present invention relates to a digital circuit that includes one or more quantum wire resonant tunneling transistors (QWRTTs), wherein at least one of the QWRTTs includes: an emitter terminal, a base terminal, a collector terminal, an emitter region in connection with the emitter terminal, a base region in connection with the base terminal, a collector region in connection with the collector terminal, an emitter barrier region between the emitter region and the base region, and a collector barrier region between the collector region and the base region, wherein at least one of the emitter region, the base region, and the collector region comprises a plurality of metal quantum wires.

Implementations of the system may include one or more of the following. The digital circuit can further include a complementary logic gate comprising: an input node, an output node, a pull-down network comprising the one or more QWRTTs, and a pull-up network comprising the one or more QWRTTs, wherein the pull-down network and the pull-up network can form dual networks, in which a parallel connection of the one or more QWRTTs in the pull-down network corresponds to a series connection of the one or more QWRTTs in the pull-up network, or in which a series connection of the one or more QWRTTs in the pull-down network corresponds to a parallel connection of the one or more QWRTTs in the pull-up network. The input node of the complementary logic gate can be connected to the base terminal of one of the one or more QWRTTs in the pull-down network, wherein the input node of the complementary logic gate can be connected to the base terminal of one of the one or more QWRTTs in the pull-up network. The pull-down network of the complementary logic gate can include one or more enhancement-mode QWRTTs with positive on voltage $V_{ON}$, wherein the pull-up network of the complementary logic gate can include one or more enhancement-mode QWRTTs with negative $V_{ON}$. The pull-down network of the complementary logic gate can include one or more normally on QWRTTs, wherein the pull-up network of the complementary logic gate can include one or more normally on QWRTTs. The pull-down network of the complementary logic gate can include one or more n-type QWRTTs, wherein the pull-up network of the complementary logic gate can include one or more n-type QWRTTs. The complementary logic gate can include an AND gate, an OR gate, a NOT gates, a buffer, a NAND gate, a NOR gate, or a combination thereof. The digital circuit can further include a pass transistor logic gate comprising one or more enhancement-mode QWRTTs having positive $V_{ON}$, one or more enhancement-mode QWRTTs having negative $V_{ON}$, or a combination thereof. The digital circuit can further include a memory element comprising a bistable circuit to store a bit of data, wherein the bistable circuit includes the one or more QWRTTs. The bistable circuit can include two inverters or a buffer. The memory element can be characterized by a six-transistor (6T) SRAM cell comprising two cross-coupled inverters formed by four enhancement-mode QWRTTs, two access transistors formed by two enhancement-mode QWRTTs, a word line, and two bit lines, wherein the word line and the two bit lines can address the SRAM cell and access stored data in read and write operations. The memory element can be characterized by a three-transistor (3T) SRAM cell comprising: a buffer formed by two normally on QWRTTs, an access transistor formed by an enhancement-mode QWRTT, a word line, and a bit line, wherein the word line and the bit line can address the SRAM cell and access stored data in read and write operations. The one or more QWRTTs can include n-type devices and p-type devices, wherein both the n-type devices and the p-type devices can be configured as normally on transistors with $V_{ON}=0$ V, enhancement-mode transistors with positive $V_{ON}$, or enhancement-mode transistors with negative $V_{ON}$. The enhancement-mode QWRTTs can have multiple $V_{ON}$ values, wherein the enhancement-mode QWRTTs can operate at multiple power supply voltages. The plurality of metal quantum wires can be formed by implantation of metal ions into the open channels of a crystalline semiconductor, wherein a mask layer used in the ion implantation can be aligned to the lattice structure on a wafer surface.

The details of one or more embodiments are set forth in the accompanying drawing and in the description below. Other features, objects, and advantages of the invention will become apparent from the description and drawings, and from the claims.

BRIEF DESCRIPTION OF THE DRAWINGS

The accompanying drawing, which are incorporated in and form a part of this specification, illustrate embodiments of the invention and, together with the description, serve to explain the principles of the invention:

FIG. 9 shows the transfer I-V curves of 3 n-type QWRTTs with different ($N_E$, $N_B$, $N_C$).

FIG. 10 shows the transfer I-V curves of 3 n-type QWRTTs with different ($q\phi_{bnE}$, $q\phi_{bnB}$, $q\phi_{bnC}$).

FIG. 11 shows the circuit symbols of the QWRTT.

FIG. 14a shows the circuit diagram of an inverter constructed using both n- and p-type enhancement-mode QWRTTs.

FIG. 14b shows the circuit diagram of an inverter constructed using only n-type enhancement-mode QWRTTs.

FIG. 15a shows the circuit diagram of a buffer constructed using both n- and p-type normally on QWRTTs.

FIG. 15b shows the circuit diagram of a buffer constructed using only n-type normally on QWRTTs.

FIG. 16a shows the circuit diagram of a 2-input NAND gate constructed using both n- and p-type enhancement-mode QWRTTs.

FIG. 16b shows the circuit diagram of a 2-input NOR gate constructed using both n- and p-type enhancement-mode QWRTTs.

FIG. 20a shows the circuit schematic of a bistable circuit constructed with two cross-coupled inverters.

FIG. 20b shows the circuit diagram of the bistable circuit as shown in FIG. 20a constructed using both n- and p-type QWRTTs.

FIG. 20c shows the circuit diagram of the bistable circuit as shown in FIG. 20a constructed using only n-type QWRTTs.

FIG. 21a shows the circuit schematic of a bistable circuit constructed with a buffer.

FIG. 21b shows the circuit diagram of the bistable circuit as shown in FIG. 21a constructed using both n- and p-type QWRTTs.

FIG. 21c shows the circuit diagram of the bistable circuit as shown in FIG. 21a constructed using only n-type QWRTTs.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
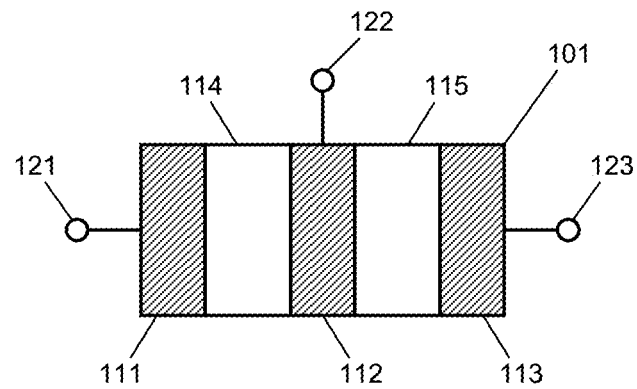
FIG. 1 shows the schematic drawing of a Quantum Wire Resonant Tunneling Transistor (QWRTT).

Quantum Wire Resonant Tunneling Transistor (QWRTT) is a three-terminal device. FIG. 1 shows the schematic drawing of a QWRTT 101. The three terminals include an emitter terminal 121, a base terminal 122, and a collector terminal 123. The device structure of the QWRTT 101 consists of an emitter region 111, a base region 112, a collector region 113, an emitter barrier region 114, and a collector barrier region 115. The emitter region 111, the base region 112, and the collector region 113 each includes a semiconductor embedded with two or more metal quantum wires. The semiconductor in the emitter region 111, the base region 112, and the collector region 113 can be, for example, silicon, germanium, or silicon germanium alloys. The emitter barrier region 114 and the collector barrier region 115 are made of one or more semiconductor materials such as silicon, germanium, and silicon germanium alloys. The semiconductor can be undoped or lightly doped.

Figure 2A:
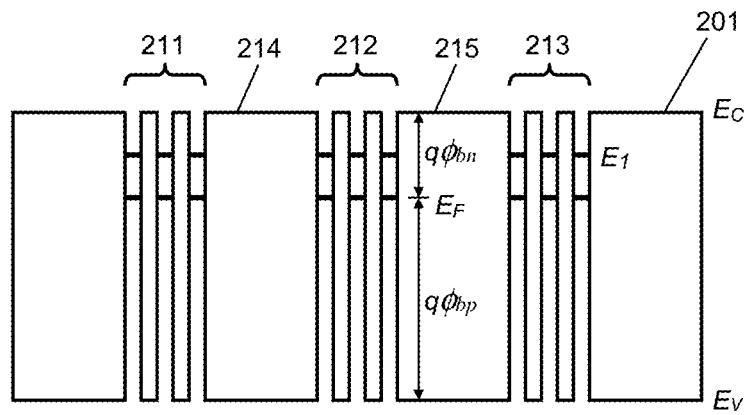
FIG. 2a shows the band diagram of an n-type QWRTT.
Figure 2B:
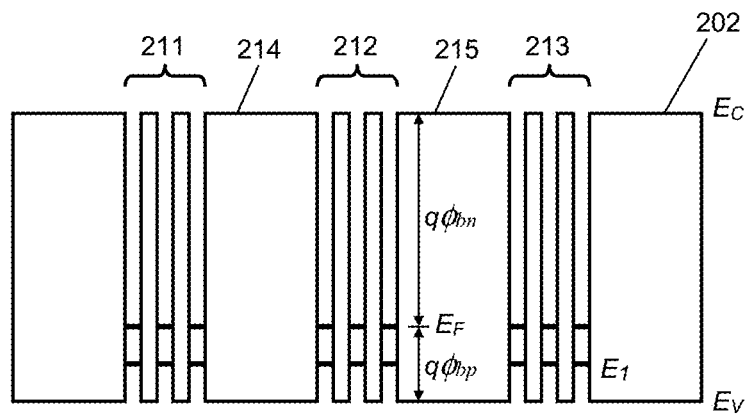
FIG. 2b shows the band diagram of a p-type QWRTT.

The QWRTT has two complementary device types: n type and p type. The primary carriers are electrons in an n-type QWRTT, and holes in a p-type QWRTT. FIG. 2a shows the band diagram of an n-type QWRTT 201, and FIG. 2b shows the band diagram of a p-type QWRTT 202. The n-type QWRTT 201 and p-type QWRTT 202 each includes an emitter region 211, a base region 212, a collector region 213, an emitter barrier region 214, and a collector barrier region 215. $E_C$ is the conduction band edge, and $E_V$ is the valence band edge of the semiconductor. $E_F$ is the Fermi level of the metal that forms the quantum wires. For the n-type QWRTT 201, $E_F$ is closer to $E_C$ than $E_V$, and the electron Schottky barrier height $q\phi_{bn}$ is smaller than the hole Schottky barrier height $q\phi_{bp}$. Hence the primary carriers are electrons. On the other hand, for the p-type QWRTT 202, $E_F$ is closer to $E_V$ than $E_C$, and $q\phi_{bp}$ is smaller than $q\phi_{bn}$. Hence the primary carriers are holes.

Figure 3A:
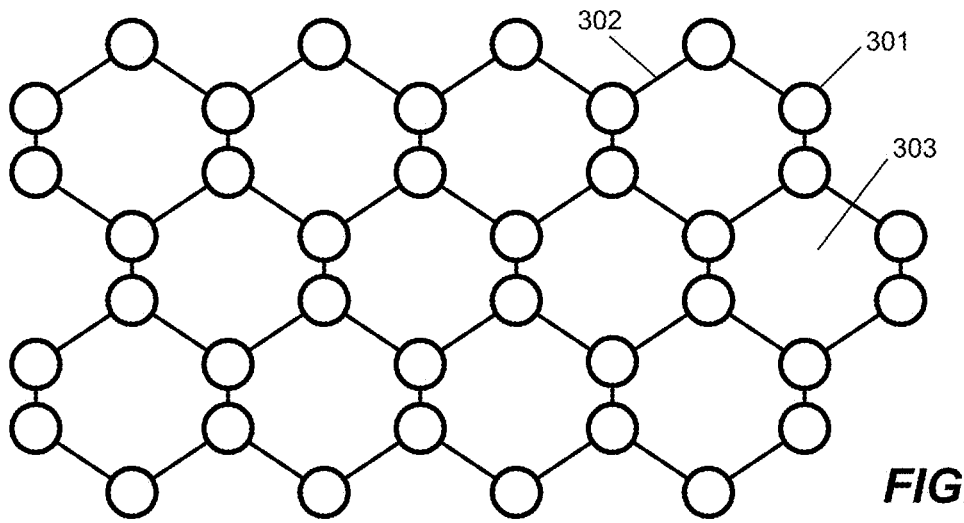
FIG. 3a shows a silicon lattice structure viewed in the <110> direction.
Figure 3B:
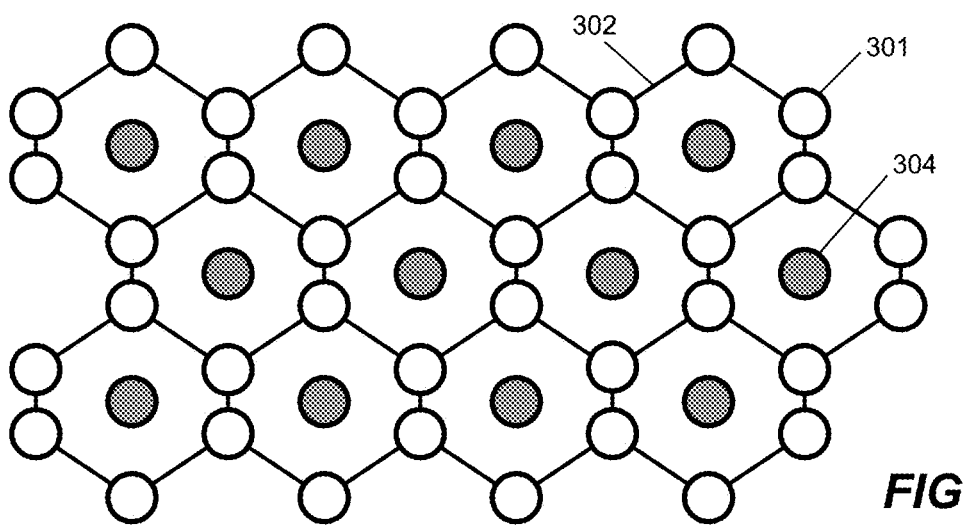
FIG. 3b shows the same silicon lattice structure after ion implantation.

Silicon has a diamond cubic lattice structure, which is a very open structure with an atomic packing factor of 0.34. FIG. 3a shows the silicon lattice structure viewed in the <110> direction. A honeycomb structure formed by silicon atoms 301 can be seen. The honeycomb structure has an array of hexagonal hollow cells 302. Each cell has a large opening at the center. The opening forms an open channel 303 in the ion implantation process. In the example of silicon, the open channels are oriented along the <110> direction and are substantially parallel to each other. If ions of light elements are implanted along the open channel direction, the ions will be steered along such open channels without encountering any target nuclei. The implant range can be much longer than other directions. This effect is called ion channeling. It is an undesirable effect in the ion implantation process. However, this unfavorable ion channeling effect can be used to create quantum wires of atomic size. FIG. 3b shows the silicon lattice structure viewed in the <110> direction after ion implantation. Metal atoms 304 are embedded in the open channels 303. A quantum wire is formed when the metal atoms 304 in an open channel 303 are continuously distributed and electrically connected.

Figure 4A:
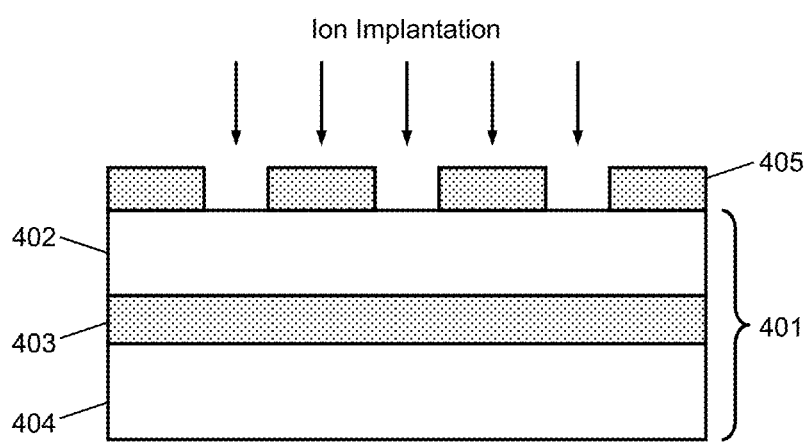
FIG. 4a shows the layer structure at the step of ion implantation.
Figure 4B:
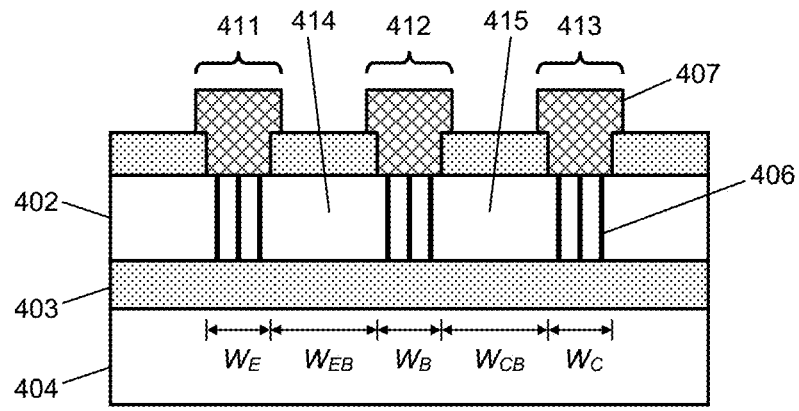
FIG. 4b shows the layer structure after a metal layer is deposited and patterned.

An exemplary fabrication process to build the QWRTT is described below. FIG. 4a shows the layer structure at the step of ion implantation, and FIG. 4b shows the layer structure after a metal layer is patterned. The starting material is a silicon-on-insulator (SOI) (110) wafer 401. The wafer includes a top silicon layer 402 with a thickness of about 100 Å, a mid oxide layer 403, and a bottom silicon substrate 404. The top silicon layer 402 has a crystal lattice comprising open channels 303 as shown in FIG. 3a. The thickness of the top silicon layer 402 is generally less than 500 Å. A layer of silicon dioxide $SiO_2$ 405 is deposited and patterned. The $SiO_2$ layer 405 is used as a mask layer for the following ion implantation step. (In addition to silicon dioxide, a wide variety of materials such as silicon nitride $Si_3N_4$, polysilicon, metals, and photoresist can be used as the masking materials for ion implantation.) Ions of metals with suitable work functions are implanted vertically to the silicon wafer in the <110> direction. If wafers with other crystal orientations are used, such as (100) and (111), the implant angle needs to be tilted to the <110> direction. The implanted ions travel along the open channels 303. The channels end at the silicon-oxide interface because silicon dioxide is amorphous. After the implantation, the open channels 303 are filled with metal atoms, and quantum wires 406 are formed. The implantation damage to the silicon lattice on the surface is removed by chemical etch. A metal layer 407 is deposited and patterned for interconnection.

As shown in FIG. 4b, the emitter region 411, the base region 412, and the collector region 413 have metal quantum wires 406 embedded in a semiconductor 402. The emitter region 411 and the base region 412 are separated by the emitter barrier region 414. The collector region 413 and the base region 412 are separated by the collector barrier region 415. $W_E$ is the width of the emitter region 411, $W_B$ is the width of the base region 412, and $W_C$ is the width of the collector region 413, $W_{EB}$ is the width of the emitter barrier region 414, and $W_{CB}$ is the width of the collector barrier region 415.

In some embodiments, the metal quantum wires 406 can be approximately perpendicular to the silicon layer 402. The lengths of the metal quantum wires 406 are generally shorter than 500 Å. The emitter region 411, the base region 412, and the collector region 413 can have the same or different numbers of metal quantum wires 406 along the emitter-base-collector (E-B-C) direction. Moreover, the metal quantum wires 406 in the emitter region 411, the base region 412, and the collector region 413 can be formed of the same or different materials.

In the QWRTT fabrication process, photolithography needs to meet two rigorous requirements of resolution and registration. As a quantum device, the QWRTT has a very small size. The typical device in simulations has the dimensions of $W_{EB}=W_{CB}=26$ Å and $W_E=W_B=W_C=10$ Å. With the emergence of extreme ultraviolet (EUV) lithography, the resolution requirement could be achieved by combining the EUV lithography with other techniques such as multiple patterning and sidewall spacers. Conventionally, registration is a measure of how accurately the patterns on a mask can be aligned to previously defined patterns on a wafer. In the exemplary QWRTT fabrication process, the implant mask layer 405 needs to be aligned to the silicon lattice structure, so that the open channel 303 can be precisely controlled to be fully open or close at the ion implantation step. It is a new requirement to lithography that the patterns on a mask are aligned to the lattice structure on a wafer surface. There are some microscopes such as scanning tunneling microscope (STM) that can image the wafer surface with atomic scale resolution. The image information is then provided to lithography equipment for mask alignment, so the mask layer can be aligned to the lattice structure on a wafer surface.

Figure 5:
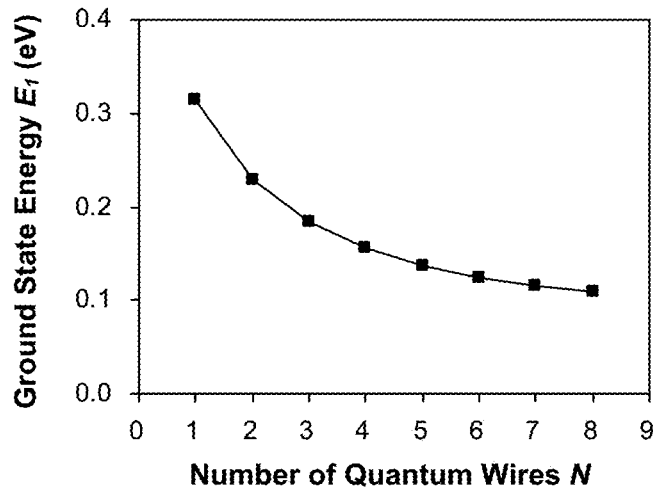
FIG. 5 shows the ground state energy $E_1$ vs. the number of quantum wires N of a superlattice structure.

The emitter/base/collector (E/B/C) regions 411-413 as shown in FIG. 4*b* are periodic structures of metal and semiconductor, which can be considered as superlattice. The electrons in a metal quantum wire are confined to a two-dimensional (2-D) potential well. Electrons can only have discrete energy values inside a potential well. The ground state energy $E_1$ as shown in FIG. 2*a* is found to be a function of potential barrier height (such as $q\phi_{bn}$) and superlattice size (such as $W_E$, $W_B$, and $W_C$). FIG. 5 shows the ground state energy $E_1$ for electrons as a function of the number of quantum wires N in a superlattice along the current flow direction, which is the E-B-C direction. The potential barrier height $q\phi_{bn}$ is assumed to be 0.42 eV. Since the superlattice size is proportional to the number of quantum wires N, it is found that $E_1$ is smaller for a larger superlattice with more quantum wires.

The device characteristics of a QWRTT can be obtained from solving the one-dimensional (1-D) time-independent Schrodinger equation $$-\frac{\hbar^2}{2m}\frac{d^2\psi(x)}{dx^2} + U(x)\psi(x) = E\psi(x) \tag{1}$$

where $\psi(x)$ is the wave function, $U(x)$ is the potential energy, E is the total energy, m is the carrier effective mass, and $\hbar$ is the reduced Planck constant. The general solution has the form $$\psi(x) = A\, e^{iKX} + Be^{-iKX} \tag{2}$$

where $\kappa$ is the wave number, which is given by $$\frac{\hbar^2 \kappa^2}{2m} = E - U(x). \tag{3}$$

The tunneling probability or transmission coefficient T is given by $$T = \left|\frac{A_C}{A_E}\right|^2 \tag{4}$$

where $A_C$ and $A_E$ are the coefficient A of the collector and emitter, respectively. According to the Fermi's golden rule, the tunneling current from emitter to collector is proportional to the transmission coefficient multiplied by the occupied states in emitter and the unoccupied states in collector. The tunneling current from collector to emitter can be obtained correspondingly. Since the Fermi's golden rule tells a proportional relation, the tunneling currents shown in this application use an arbitrary unit (a. u.) as the scale. The tunneling currents are given by $$I_{E\to C} \propto \frac{4\pi q}{\hbar} \int T\rho_E\rho_C F_E(1 - F_C)dE \tag{5}$$

$$I_{C\to E} \propto \frac{4\pi q}{\hbar} \int T\rho_E\rho_C F_C(1 - F_E)dE. \tag{6}$$

$F_E$ and $F_C$ are the Fermi-Dirac distribution functions in the emitter and collector, respectively. $\rho_E$ and $\rho_C$ are the densities of states in the emitter and collector, respectively. The QWRTT has 1-D metal quantum wires in the E/B/C regions, so the carriers have 1-D density of states (DOS) $\rho_{1\text{-}D}$ given below $$\rho_{1\text{-}D} = \frac{1}{\pi\hbar} \cdot \sqrt{\frac{m}{2(E - E_1)}} \tag{7}$$

when E is larger than $E_1$. The net tunneling current I can be written as $$I = I_{E\to C} - I_{C\to E} \propto \frac{4\pi q}{\hbar} \int T\rho_E\rho_C(F_E - F_C)dE. \tag{8}$$

When a carrier with energy below the barrier height transports through a potential barrier, this carrier contributes to the tunneling current. When a carrier with energy above the barrier height transports across a potential barrier, this carrier contributes to the thermionic emission current. The integration in Eq. 8 takes place from $E_1$ to infinite (or an energy much higher than the barrier height). The current obtained from Eq. 8 includes both the tunneling current and the thermionic emission current. Since device biases are very small, very few carriers can obtain energy above the barrier height. The thermionic emission current is negligible. Quantum mechanical tunneling effect dominates the carrier transport process. The current obtained from Eq. 8 is primarily attributed to the tunneling current.

When the E/B/C regions have identical superlattice structures (i.e., the numbers of quantum wires N and the metal Fermi levels $E_F$ are the same in the E/B/C regions), then their $E_1$ values are the same. $E_1$ is said to be "in alignment" in the E/B/C regions. The number of quantum wires Nis denoted as $N_E$, $N_B$, and $N_C$ in the E/B/C regions respectively along the emitter-base-collector (E-B-C) direction. The ground state energy $E_1$ is denoted as EIE, EIB, and $E_{1C}$ in the E/B/C regions, respectively. The Schottky barrier height for electrons $q\phi_{bn}$ is denoted as $q\phi_{bnE}$, $q\phi_{bnB}$, and $q\phi_{bnC}$ in the E/B/C regions, respectively. The Schottky barrier height for holes $q\phi_{bp}$ is denoted as $q\phi_{bpE}$, $q\phi_{bpB}$, and $q\phi_{bpC}$ in the E/B/C regions, respectively.

Figure 6:
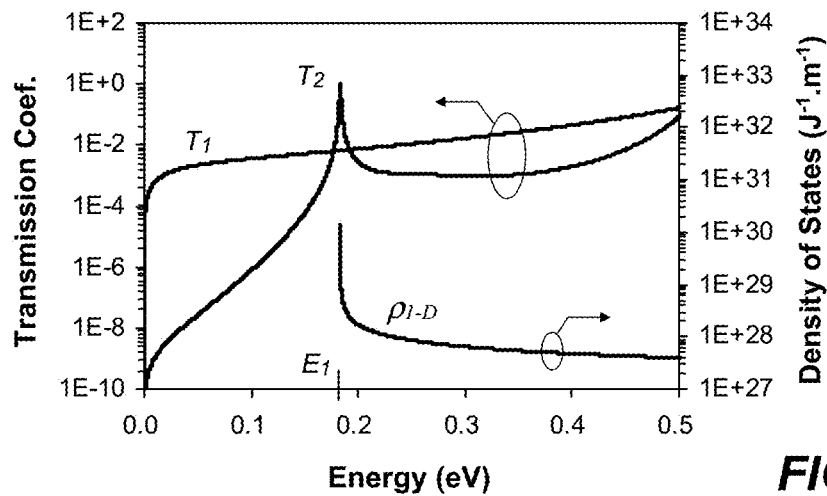
FIG. 6 shows the electron transmission coefficients and 1-D DOS $\rho_{1\text{-}D}$ vs. energy of an n-type QWRTT.

In some embodiments, the emitter region 111, the base region 112, and the collector region 113 (as shown in FIG. 1) each includes three metal quantum wires embedded in a semiconductor along the E-B-C direction. FIG. 6 shows the electron transmission coefficients and 1-D DOS $\rho_{1\text{-}D}$ versus energy of an n-type QWRTT with $N_E=N_B=N_C=3$, $q\phi_{bnE}=q\phi_{bnB}=q\phi_{bnC}=0.42$ eV, $W_{EB}=W_{CB}=26$ Å, and $V_E=V_B=V_C=0$ V. $T_1$ is the transmission coefficient of a single-barrier structure between base and collector (or between base and emitter). $T_2$ is the transmission coefficient of a double-barrier structure between emitter and collector. $T_2$ exhibits the resonant tunneling effect. When an injected electron has energy of $E_1$, $T_2$ reaches its maximum of 100%. The device is said to be "in resonance", and a maximum amount of current can flow through the double-barrier structure if a voltage difference is present between the emitter and collector. $T_2$ decreases rapidly as the energy deviates from $E_1$.

The barrier width of a single-barrier structure is smaller than the combined barrier width of a double-barrier structure. As shown in FIG. 6, $T_2$ is smaller than $T_1$ at most energy values. Only when the energy nears $E_1$ and the device is in resonance, $T_2$ becomes much larger than $T_1$. According to the Fermi's golden rule, the tunneling current is proportional to the transmission coefficient. The base leakage current flowing through the single-barrier structure between base and collector (or between base and emitter) is proportional to $T_1$, and the device driving current flowing through the double-barrier structure between emitter and collector is proportional to $T_2$. The 1-D density of states $\rho_{1\text{-}D}$ is maximal at $E_1$ and drops rapidly as the energy is off E1. Both $T_2$ and $\rho i\text{-}D$ are maximal when the energy nears $E_1$. A QWRTT can have a large driving current and a small base leakage current because (a) the current conduction mechanism is the resonant tunneling effect and (b) the emitter and collector have 1-D quantum wire structures with 1-D density of states.

Figure 7A:
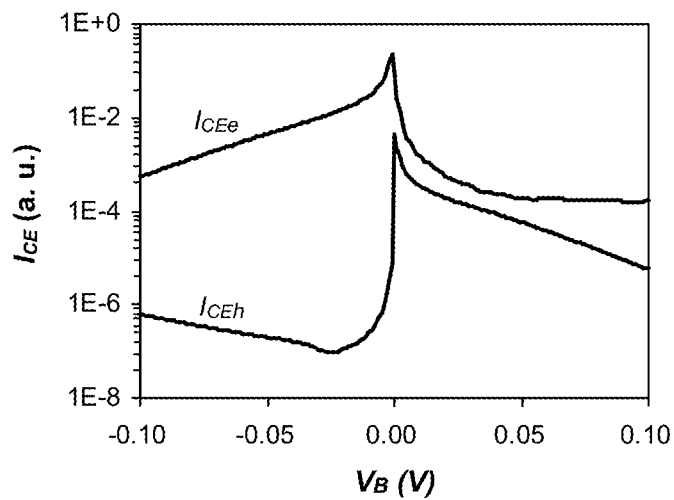
FIG. 7a shows the transfer I-V curves of an n-type QWRTT.

FIG. 7a shows the transfer I-V curves of an n-type QWRTT with $N_E=N_B=N_C=3$, $q\phi_{bnE}=q\phi_{bnB}=q\phi_{bnC}=0.42$ eV, $W_{EB}=W_{CB}=26$ Å, $V_E=0$ V, and $V_C=1$ mV. The device driving current $I_{CE}$ is the current between the collector terminal 123 and the emitter terminal 121 (as shown in FIG. 1). $I_{CE}$ is the combined current of the electron current $I_{CEe}$ and the hole current $I_{CEh}$, i.e., $I_{CE}=I_{CEe}\ I_{CEh}$. Because the electron and hole currents behave differently with respect to a change in $V_B$, an n-type device is designed so that electrons are the majority carriers and the hole current is always smaller than the electron current in the operation range. All the simulation results shown in this application are performed at a temperature of 300° K. Most material properties are temperature dependent, despite the quantum mechanical tunneling effect is temperature independent.

The electron current $I_{CEe}$ reaches its peak when $V_B$ is about 0 V. When $V_B$ is in the range of [0, 50] mV, $I_{CEe}$ decreases with increasing $V_B$. $I_{CEe}$ exhibits a negative differential resistance (NDR) phenomenon due to the resonance tunneling effect. The peak-to-valley current ratio is about three orders of magnitude. The hole current $I_{CEh}$ also exhibits the NDR phenomenon when $V_B$ is in the range of [−50, 0] mV due to the resonance tunneling effect.

Swing S is defined as the change in the control voltage (such as the gate voltage VG of a MOSFET or the base voltage $V_B$ of a QWRTT) that is required to change the device current by one decade. A small swing means the transfer I-V curve has a steep slope. As shown in FIG. 7a, the swing has a very small value when $V_B$ is in the neighborhood of 0 V. For example, S=3 mV/dec when $V_B$ is in the positive range of [0, 5] mV, and S=7.4 mV/dec when $V_B$ is in the negative range of [−5, 0] mV. The swing is required to be small, so that a transistor can be switched between on and off with a small change in the control voltage. The power supply voltage and power consumption can then be reduced. The theoretically minimal subthreshold swing for a conventional MOSFET at room temperature is 60 mV/dec. The swing of a QWRTT is much smaller than that of a MOSFET is attributed to two key factors: (a) resonant tunneling and (b) 1-D density of states.

Figure 7B:
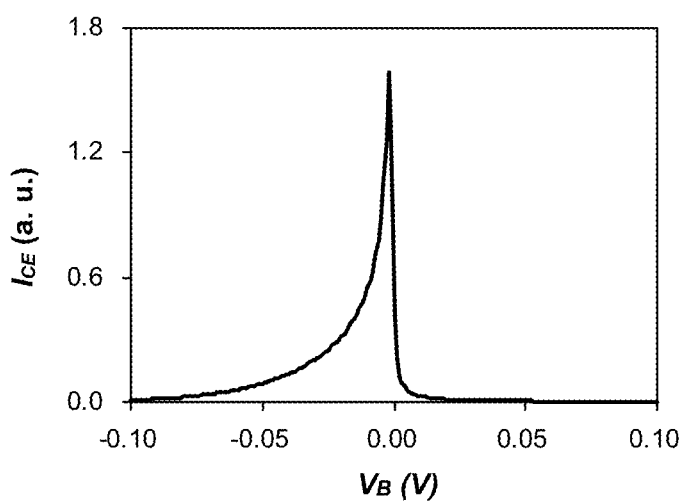
FIG. 7b shows the device driving current vs. $V_B$ of an n-type QWRTT.

FIG. 7b shows the device driving current $I_{CE}$ in linear scale vs. $V_B$ of the same device with $V_C=V_{CC}$ and $V_E=0$ V. The power supply voltage $V_{CC}$ is assumed to be 50 mV. The device driving current is maximal when $V_B$ is about 0 V. The current drops rapidly when $V_B$ is off 0 V. The I-V curve looks like an impulse, which is approximately symmetrical about $V_B=0$ V. The QWRTT is the only known device that has an impulse-like I-V characteristic curve. The device is on when $V_B=0$ V, and the device is off when $V_B$ is either $+V_{CC}$ or $-V_{CC}$. The QWRTT is a normally on transistor when $E_1$ is in alignment in the E/B/C regions, i.e., $E_{1E}=E_{1B}=E_{1C}$.

On voltage $V_{ON}$ is defined as the base-to-emitter voltage $V_{BE}$ (or the base voltage $V_B$ if $V_E=0$ V) when a QWRTT is on. A normally on transistor with $V_{ON}=0$ V is on when $V_B=V_E=0$ V. However, it does not mean the device current is maximal when $V_B=0$ V. In simulations, the device current of a normally on device is maximal when $V_B$ is about 0 V but may not be exactly at 0 V. For example, $I_{CEe}$ is maximal when $V_B=-1$ mV as shown in FIG. 7a, and $I_{CE}$ is maximal when $V_B=-2$ mV as shown in FIG. 7b. Since these $V_B$ values are close to 0 V, $V_{ON}$ is considered to be 0 V for digital circuit applications. $V_{ON}$ is mainly used to differentiate between normally on transistors and enhancement-mode transistors. For example, a device with $V_{ON}=0$ V is a normally on transistor. A device with positive $V_{ON}$ is an enhancement-mode transistor, which is on when $V_{BE}$ is positive (such as $V_{CC}$). A device with negative $V_{ON}$ is an enhancement-mode transistor, which is on when $V_{BE}$ is negative (such as $-V_{CC}$).

Figure 7C:
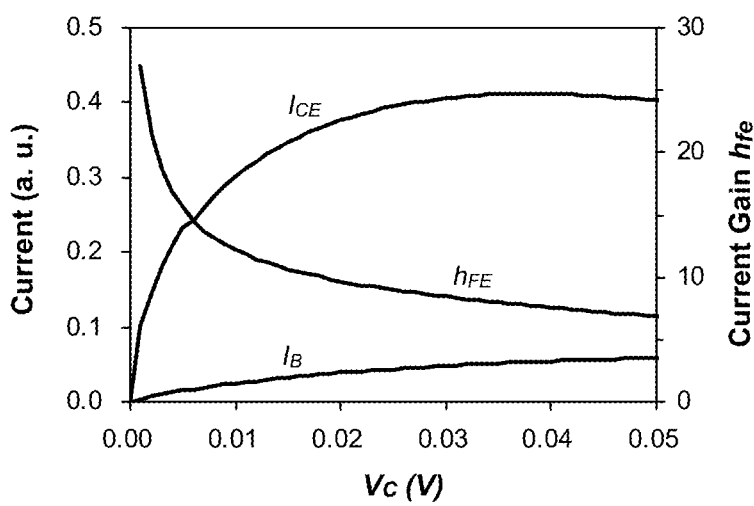
FIG. 7c shows the output characteristics of an n-type QWRTT.

FIG. 7c shows the output characteristics of the same device with $V_E=V_B=0$ V. DC current gain $h_{FE}$ is the amplification factor of a transistor. It is the ratio of device driving current and input current. The input current is the base current $I_B$, which consists of base-to-collector current $I_{BC}$ and base-to-emitter current $I_{BE}$. Since $V_{BE}=0$ V, so $I_{BE}=0$ and $h=I_{BC}$. The DC current gain $h_{FE}$ ($=I_{CE}/I_B$) ranges from 7 to 28 in the operation range. The device driving current $I_{CE}$ flowing through a double-barrier structure is larger than the base current h flowing through a single-barrier structure, which is attributed to the resonant tunneling effect and the 1-D density of states of the quantum wires in the emitter and collector regions.

Figure 8A:
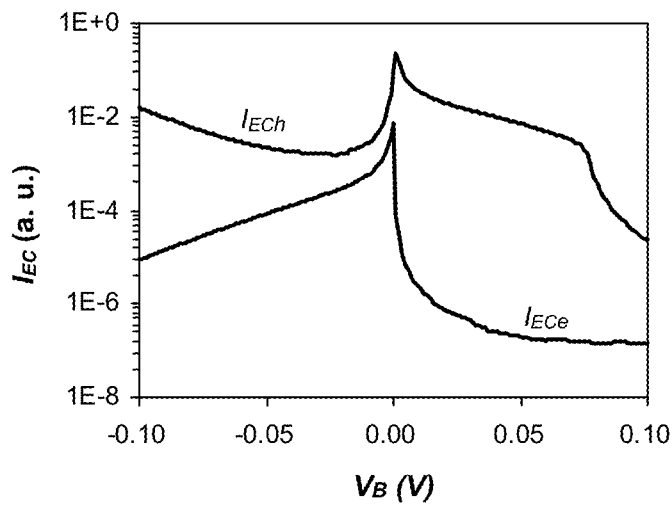
FIG. 8a shows the transfer I-V curves of a p-type QWRTT.

FIG. 8a shows the transfer I-V curves of a p-type QWRTT with $N_E=N_B=N_C=3$, $q\phi_{bpE}=q\phi_{bpB}=q\phi_{bpC}=0.24$ eV, $W_{EB}=W_{CB}=26$ Å, $V_E=0$ V, and $V_C=-1$ mV. The device driving current $I_{EC}$ is the current between the emitter terminal 121 and the collector terminal 123 (as shown in FIG. 1). $I_{EC}$ is the combined current of the hole current $I_{ECh}$ and the electron current $I_{ECe}$, i.e., $I_{EC}=I_{ECh}+I_{ECe}$. For a p-type QWRTT, the metal Fermi level $E_F$ is closer to the valance band edge than the conduction band edge, so the primary carriers are holes. The electron current is always smaller than the hole current in the operation range. The hole current $I_{ECh}$ is maximal and the device is at resonance when $V_B$ is about 0 V. The hole current $I_{ECh}$ exhibits an NDR phenomenon when $V_B$ is in the range of [−50, 0] mV. The peak-to-valley current ratio is about two orders of magnitude. The electron current $I_{ECe}$ also exhibits an NDR phenomenon when $V_B$ is in the range of [0, 50] mV. The hole current $I_{ECh}$ has a small swing when $V_B$ is in the neighborhood of 0 V. S=3.3 mV/dec when $V_B$ is in the negative range of [−5, 0] mV, and S=8.1 mV/dec when $V_B$ is in the positive range of [0, 5] mV.

Figure 8B:
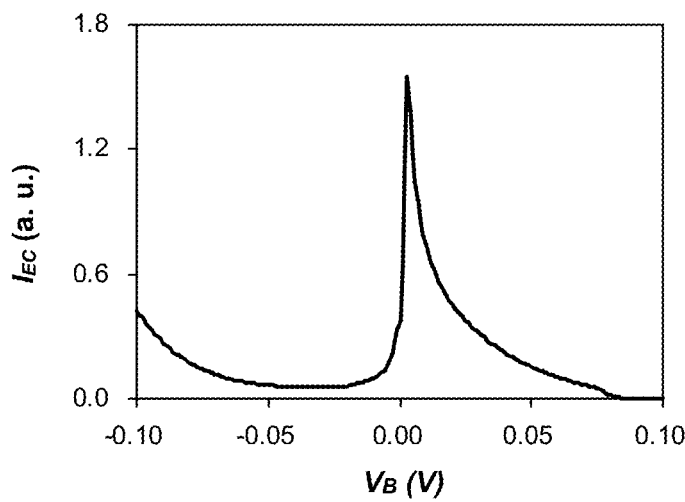
FIG. 8b shows the device driving current vs. $V_B$ of a p-type QWRTT.

FIG. 8b shows the device driving current $I_{EC}$ in linear scale vs. $V_B$ of the same device with $V_C=-V_{CC}=-50$ mV and $V_E=0$ V. The device driving current is maximal when $V_B$ is about 0 V. The current drops rapidly when $V_B$ is off 0 V. The I-V curve looks like an impulse, which is approximately symmetrical about $V_B=0$ V. The device is on when $V_B=V_{ON}=0$ V, and the device is off when $V_B$ is either $+V_{CC}$ or $-V_{CC}$. The p-type QWRTT is a normally on transistor with $V_{ON}=0$ V when Er is in alignment in the E/B/C regions, i.e., $E_{1E}=E_{1B}=E_{1C}$.

Figure 8C:
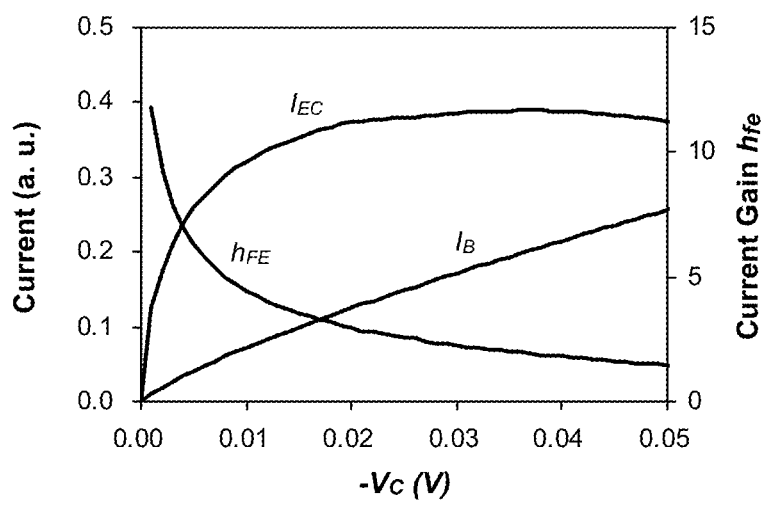
FIG. 8c shows the output characteristics of a p-type QWRTT.

FIG. 8c shows the output characteristics of the same device with $V_E=V_B=0$ V. The base current h is equal to the base-to-collector current $I_{BC}$ because the base-to-emitter current $I_{BE}$ is zero due to $V_{BE}=0$ V. The DC current gain $h_{FE}$ ($=I_{EC}/I_B$) ranges from 1.5 to 12 in the operation range, which is smaller than that of an n-type device because the hole effective mass is larger than the electron effective mass in silicon. Effective mass is the primary difference between the n- and p-type devices in simulations, since both devices in FIGS. 7c and 8c have the same dimensions.

FIGS. 7c and 8c show the output characteristics of n- and p-type normally on QWRTTs. The base currents $I_B$ continuously increase with increasing $|V_C|$, while the device driving currents saturate when $|V_C|$ is larger than about 30 mV. In the saturation region, the device driving currents roughly stay as constants with respect to the variation of $|V_C|$. Therefore, scaling down the power supply voltage $V_{CC}$ can reduce both the dynamic and static power consumptions without much performance sacrifice because the device driving current of a normally on transistor in the saturation region is almost independent of $V_{CC}$.

In some embodiments, a QWRTT can be configured as an enhancement-mode transistor by having $E_1$ out of alignment in the E/B/C regions. Since $E_1$ is dependent of the superlattice size and the potential barrier height, $E_1$ can be modified by changing the number of quantum wires or the Schottky barrier heights in the E/B/C regions. Take an example of three n-type QWRTTs: Q1, Q2, and Q3. They have the same device parameters of $N_B=3$, $q\phi_{bnE}=q\phi_{bnB}=q\phi_{bnC}=0.42$ eV, and $W_{EB}=W_{CB}=26$ Å. However, they have different $N_E$ and $N_C$ values, for example, $(N_E, N_B, N_C)=(2, 3, 2)$, $(3, 3, 3)$, and $(5, 3, 5)$ for Q1, Q2, and Q3, respectively. FIG. 9 shows the transfer I-V curves (i.e., $I_{CEe}$ vs. $V_B$) of the three QWRTTs with $V_E=0$ V and $V_C=1$ mV. For Q2 with $(N_E, N_B, N_C)=(3, 3, 3)$, $E_1$ is in alignment and Q2 is a normally on transistor. For Q3 with $(N_E, N_B, N_C)=(5, 3, 5)$, $E_1$ is out of alignment. $I_{CEe}$ is maximal when $V_B$ is about 50 mV. Assume the power supply voltage $V_{CC}$ is 50 mV. Q3 is on when $V_B=V_{ON}=V_{CC}=50$ mV, and Q3 is off when $V_B=0$ V. Hence, Q3 is an enhancement-mode transistor with positive $V_{ON}$. For Q1 with $(N_E, N_B, N_C)=(2, 3, 2)$, $E_1$ is out of alignment. $I_{CEe}$ is maximal when $V_B$ is about −50 mV. Q1 is on when $V_B=V_{ON}=-V_{CC}=-50$ mV, and Q1 is off when $V_B=0$ V. Hence, Q1 is an enhancement-mode transistor with negative $V_{ON}$. FIG. 9 shows that by changing the numbers of quantum wires $(N_E, N_B, N_C)$ in the E/B/C regions, a QWRTT can be configured as a normally on transistor with $V_{ON}=0$ V (such as Q2), an enhancement-mode transistor with positive $V_{ON}$ (such as Q3), or an enhancement-mode transistor with negative $V_{ON}$ (such as Q1). The numbers of quantum wires in the E/B/C regions $(N_E, N_B, N_C)$ are controlled by the implant mask layer such as the $SiO_2$ layer 405 in FIG. 4a. The values of $(N_E, N_B, N_C)$ can be controlled by layout design, which does not require any additional process steps.

Take another example of three n-type QWRTTs: Q4, Q5, and Q6. They have the same device parameters of $N_E=N_B=N_C=3$, $q\phi_{bnE}=q\phi_{bnC}=0.42$ eV, and $W_{EB}=W_{CB}=26$ Å. However, they have different $q\phi_{bnB}$ values, for example, $(q\phi_{bnE}, q\phi_{bnB}, q\phi_{bnC})=(0.42, 0.26, 0.42)$ eV, $(0.42, 0.42, 0.42)$ eV, and $(0.42, 0.6, 0.42)$ eV for Q4, Q5, and Q6, respectively. FIG. 10 shows the transfer I-V curves (i.e., $I_{CEe}$ vs. $V_B$) of the three QWRTTs with $V_E=0$ V and $V_C=1$ mV. For Q5 with $(q\phi_{bnE}, q\phi_{bnB}, q\phi_{bnC})=(0.42, 0.42, 0.42)$ eV, $E_1$ is in alignment and Q5 is a normally on transistor. For Q6 with $(q\phi_{bnE}, q\phi_{bnB}, q\phi_{bnC})=(0.42, 0.6, 0.42)$ eV, $E_1$ is out of alignment. $I_{CEe}$ is maximal when $V_B$ is about 50 mV. Q6 is on when $V_B=V_{ON}=V_{CC}=50$ mV, and Q6 is off when $V_B=0$ V. Hence, Q6 is an enhancement-mode transistor with positive $V_{ON}$. For Q4 with $(q\phi_{bnE}, q\phi_{bnB}, q\phi_{bnC})=(0.42, 0.26, 0.42)$ eV, $E_1$ is out of alignment. $I_{CEe}$ is maximal when $V_B$ is about −50 mV. Q4 is on when $V_B=V_{ON}=-V_{CC}=-50$ mV, and Q4 is off when $V_B=0$ V. Hence, Q4 is an enhancement-mode transistor with negative $V_{ON}$. FIG. 10 shows that by changing the Schottky barrier heights in the E/B/C regions, i.e., $(q\phi_{bnE}, q\phi_{bnB}, q\phi_{bnC})$, a QWRTT can be configured as a normally on transistor (such as Q5), an enhancement-mode transistor with positive $V_{ON}$ (such as Q6), or an enhancement-mode transistor with negative $V_{ON}$ (such as Q4). However, additional process steps are required in order to provide the variations in $(q\phi_{bnE}, q\phi_{bnB}, q\phi_{bnC})$.

Similarly, a p-type QWRTT can also be configured as an enhancement-mode transistor if Er is out of alignment in the E/B/C regions. FIG. 11 shows the circuit symbols of the QWRTT. The QWRTT has two device types: n type and p type. Both n- and p-type QWRTTs can be configured as normally on transistors with $V_{ON}=0$ V, enhancement-mode transistors with positive $V_{ON}$, or enhancement-mode transistors with negative $V_{ON}$. Hence, the QWRTT includes two transistor families: normally on transistors and enhancement-mode transistors. In total, the QWRTT has six different device variants. The letter of "N" or "P" in the circuit symbol indicates its device type, i.e., n type or p type. The plus or minus sign in the circuit symbol indicates the sign of its $V_{ON}$ value. If the circuit symbol does not have a plus or minus sign, the device is a normally on transistor. For example, "P" means the device is a p-type normally on QWRTT, and "N+" means the device is an n-type enhancement-mode QWRTT with positive $V_{ON}$.

Referring back to FIG. 1, the QWRTT has three terminals, which are labeled as "E" for the emitter terminal 121, "B" for the base terminal 122, and "C" for the collector terminal 123. When the device structure is symmetrical (i.e., $N_E=N_C$, $q\phi_{bnE}=q\phi_{bnC}$, and $W_{EB}=W_{CB}$), the emitter terminal 121 and the collector terminal 123 are interchangeable. Since carriers move from the emitter region 111 to the collector region 113 when the device is on, the emitter terminal 121 and the collector terminal 123 are determined by the carrier flow direction. In general, the collector terminal 123 has a higher potential than the emitter terminal 121 for an n-type QWRTT, and a lower potential for a p-type QWRTT. The terminals can be easily identified, so their labels are omitted in the circuit diagrams of this application for simplicity.

The QWRTT has six different device variants as shown in FIG. 11, while the MOSFET used in digital circuits has only two device variants: n- and p-channel devices, and both devices are enhancement-mode. Hence the QWRTT circuit design can be more diversified and efficient than the CMOS circuit design. It is feasible to construct the entire logic circuits using only one type of devices. As described earlier, both n- and p-type QWRTTs can be configured as normally on transistors with $V_{ON}=0$ V, enhancement-mode transistors with positive $V_{ON}$, or enhancement-mode transistors with negative $V_{ON}$. A p-type enhancement-mode QWRTT can be replaced with an n-type enhancement-mode QWRTT with the same $V_{ON}$ since both devices having the same $V_{ON}$ perform the same logic function. Furthermore, both n- and p-type normally on QWRTTs are on when $V_B=0$ V, and off when $V_B$ is either $+V_{CC}$ or $-V_{CC}$. Both devices have impulse-like transfer I-V curves, which are approximately symmetrical about $V_B=0$ V. A p-type normally on QWRTT can be replaced with an n-type normally on QWRTT since both devices perform the same logic function. Therefore, QWRTT digital circuits can be constructed using only one type of devices, and the n-type device is obviously the choice.

Using only one type of devices to construct digital circuits has the following major advantages over the combination of both n- and p-type devices. (1) Better Circuit Performance—In silicon and most other semiconductors, electrons have smaller effective mass and higher mobility than holes. The n-type QWRTT has large driving current, higher on/off current ratio, and larger DC current gain than the p-type QWRTT with the same device dimensions. Therefore, the circuits constructed using n-type devices have better performance than the circuits constructed using the combination of both n- and p-type devices. (2) Better Current Matching—Since the hole mobility is smaller than the electron mobility, a p-type device is generally weaker than an n-type device. A p-type device needs to be larger in order to deliver the same driving current as an n-type device. If only one type of devices is in use, there is no current balancing problem between n- and p-type devices. (3) Lower Manufacturing Cost—If only one type of devices is required for circuit design, the fabrication process steps can be reduced, cycle time can be shortened, and manufacturing cost can be lowered compared with the fabrication process that is required to implement both n- and p-type devices.

The speed and power consumption of a digital circuit are closely related to the power supply voltage. Generally speaking, both the speed and power consumption are increased when the power supply voltage increases, and vice versa. The digital circuits on a chip can be divided into several zones with different priorities in speed and power consumption. The power supply voltage can be different in different zones. For example, the circuits on a critical path are emphasized on speed, so the power supply voltage in a critical-path zone can be higher to achieve higher circuit speed. The power supply voltage in a non-critical-path zone can be lower to reduce the power consumption. As a result, the signal level can be different in different zones. Level shifting circuits can be used to equalize the signal level when communicating signals between different zones. The variation of power supply voltage generally does not affect the logic function of a normally on QWRTT. On the other hand, the variation of power supply voltage could affect the logic function of an enhancement-mode QWRTT. The $V_{ON}$ value of an enhancement-mode QWRTT is typically either $V_{CC}$ or $-V_{CC}$. Since the power supply voltage can have different values in different zones, enhancement-mode QWRTTs can be configured to have different $V_{ON}$ values to operate at different power supply voltages.

Digital circuits can be generally divided into combinational logic circuits and sequential logic circuits. Combinational logic has the property that the output is only a function of the current inputs. This is in contrast to sequential logic, in which the output is a function of both the current inputs and the previous inputs. In other words, sequential logic has memory while combinational logic does not. Any combinational logic function can be implemented as a network of logic gates. It is known that {AND, NOT}, {OR, NOT}, {NAND}, and {NOR} are functionally complete sets of logic operators. The above logic gates (including AND, OR, NOT, NAND, and NOR) and three memory elements (including latch, register, and SRAM cell) are used as examples in the following to illustrate that digital circuits can be efficiently implemented using QWRTTs. It should be noted that QWRTTs are not limited to the examples described below. Instead, QWRTTs are suitable to construct many other logic circuits.

Figure 12A:
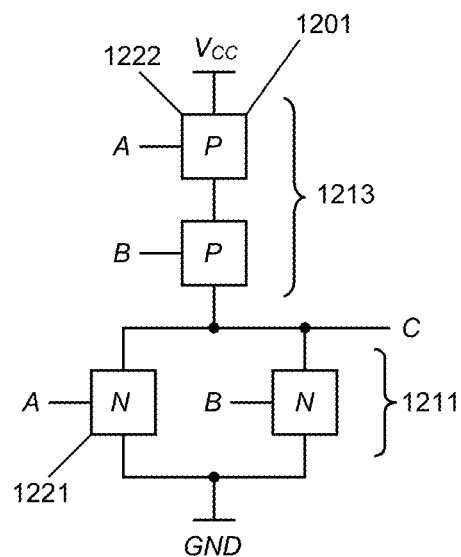
FIG. 12a shows the circuit diagram of a 2-input AND gate constructed using both n- and p-type normally on QWRTTs.
Figure 12B:
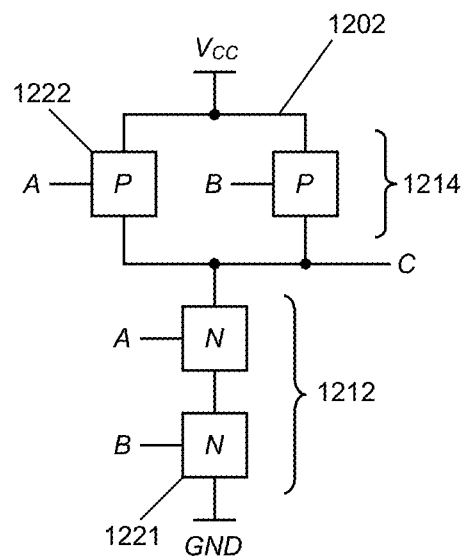
FIG. 12b shows the circuit diagram of a 2-input OR gate constructed using both n- and p-type normally on QWRTTs.

Non-inverting logic gates such as AND and OR gates can be efficiently implemented using QWRTTs. On the other hand, CMOS logic needs to combine two inverting logic gates to make one non-inverting logic gate. For example, an AND gate is obtained by combining a NAND gate and a NOT gate. FIG. 12a shows the circuit diagram of a 2-input AND gate 1201, and FIG. 12b shows the circuit diagram of a 2-input OR gate 1202. Both gates are constructed using n- and p-type normally on QWRTTs. Assume a high voltage such as the power supply voltage $V_{CC}$ represents logic 1, and a low voltage such as the ground voltage GND represents logic 0. Similar to a complementary static CMOS logic gate, each gate consists of a pull-down network (such as the pull-down network 1211 of the AND gate 1201 and the pull-down network 1212 of the OR gate 1202) and a pull-up network (such as the pull-up network 1213 of the AND gate 1201 and the pull-up network 1214 of the OR gate 1202). The function of the pull-down network is to connect the output to GND when the output is logic 0, and the function of the pull-up network is to provide a connection between the output and $V_{CC}$ when the output is logic 1. The pull-down networks 1211-1212 are constructed using n-type normally on QWRTTs 1221, and the pull-up networks 1213-1214 are constructed using p-type normally on QWRTTs 1222. The n-type QWRTTs 1221 are connected in parallel in the pull-down network 1211 of the AND gate 1201, and connected in series in the pull-down network 1212 of the OR gate 1202. The p-type QWRTTs 1222 are connected in series in the pull-up network 1213 of the AND gate 1201, and connected in parallel in the pull-up network 1214 of the OR gate 1202. In contrast, n-channel MOSFETs connected in series correspond to an AND function, and connected in parallel represent an OR function. P-channel MOSFETs connected in series correspond to a NOR function, and connected in parallel represent a NAND function. The circuit configuration of the AND gate as shown in FIG. 12a resembles a CMOS NOR gate, and the OR gate as shown in FIG. 12b resembles a CMOS NAND gate.

Figure 13A:
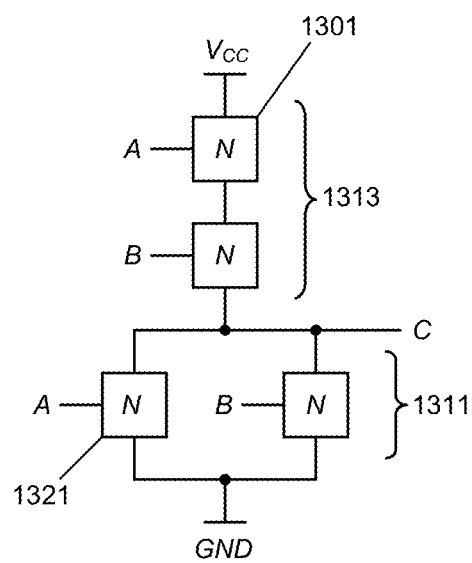
FIG. 13a shows the circuit diagram of a 2-input AND gate constructed using only n-type normally on QWRTTs.
Figure 13B:
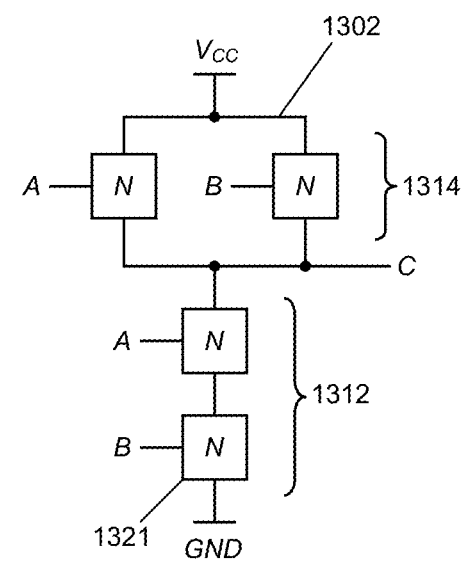
FIG. 13b shows the circuit diagram of a 2-input OR gate constructed using only n-type normally on QWRTTs.

As described before, both n- and p-type normally on QWRTTs are on when $V_B=0$ V, and off when $V_B$ is either $+V_{CC}$ or $-V_{CC}$. A p-type normally on QWRTT can be replaced with an n-type normally on QWRTT because both devices perform the same logic function. The AND gate 1201 and the OR gate 1202 can be implemented using only n-type QWRTTs by replacing the p-type normally on QWRTTs 1222 in the pull-up networks 1213-1214 with n-type normally on QWRTTs. FIG. 13a shows the circuit diagram of a 2-input AND gate 1301, and FIG. 13b shows the circuit diagram of a 2-input OR gate 1302. Both circuits are constructed using only n-type normally on QWRTTs 1321 in the pull-up networks (such as the pull-up network 1313 of the AND gate 1301 and the pull-up network 1314 of the OR gate 1302) as well as the pull-down networks (such as the pull-down network 1311 of the AND gate 1301 and the pull-down network 1312 of the OR gate 1302).

A NOT gate (i.e., an inverter) can be implemented using QWRTTs. FIG. 14a shows the circuit diagram of an inverter 1401, which consists of an n-type enhancement-mode QWRTT 1421 with positive $V_{ON}$ in the pull-down network 1411 and a p-type enhancement-mode QWRTT 1422 with negative $V_{ON}$ in the pull-up network 1412.

The inverter 1401 shown in FIG. 14a can be implemented using only n-type QWRTTs by replacing the p-type enhancement-mode QWRTT 1422 with an n-type enhancement-mode QWRTT with the same $V_{ON}$. FIG. 14b shows the circuit diagram of an inverter 1402, which consists of an n-type enhancement-mode QWRTT 1421 with positive $V_{ON}$ in the pull-down network 1413 and an n-type enhancement-mode QWRTT 1423 with negative $V_{ON}$ in the pull-up network 1414.

A digital buffer is a logic gate that has one input and one output. Its output always equals its input. The main purpose of a buffer is to drive a large capacitive load or increase the propagation delay of a signal. A buffer can be efficiently implemented with only two QWRTTs, while it takes four transistors to implement two cascaded inverters in CMOS. FIG. 15a shows the circuit diagram of a buffer 1501, which consists of an n-type normally on QWRTT 1521 in the pull-down network 1511 and a p-type normally on QWRTT 1522 in the pull-up network 1512.

The buffer 1501 shown in FIG. 15a can be implemented using only n-type QWRTTs by replacing the p-type normally on QWRTT 1522 with an n-type normally on QWRTT. FIG. 15b shows the circuit diagram of a buffer 1502, which consists of a pull-down network 1513 and a pull-up network 1514. Each network contains an n-type normally on QWRTTs 1521.

The universal logic gates such as NAND and NOR gates commonly used in CMOS digital circuits can be implemented using QWRTTs. FIG. 16a shows the circuit diagram of a 2-input NAND gate 1601, and FIG. 16b shows the circuit diagram of a 2-input NOR gate 1602. Both gates are constructed using n- and p-type enhancement-mode QWRTTs. Similar to a complementary static CMOS gate, each gate consists of a pull-down network (such as the pull-down network 1611 of the NAND gate 1601 and the pull-down network 1612 of the NOR gate 1602) and a pull-up network (such as the pull-up network 1613 of the NAND gate 1601 and the pull-up network 1614 of the NOR gate 1602). The pull-down networks 1611-1612 are constructed using n-type enhancement-mode QWRTTs 1621 with positive $V_{ON}$, and the pull-up networks 1613-1614 are constructed using p-type enhancement-mode QWRTTs 1622 with negative $V_{ON}$.

Figure 17A:
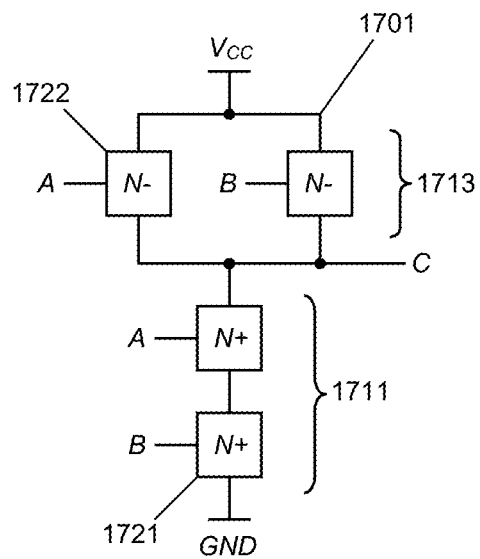
FIG. 17a shows the circuit diagram of a 2-input NAND gate constructed using only n-type enhancement-mode QWRTTs.
Figure 17B:
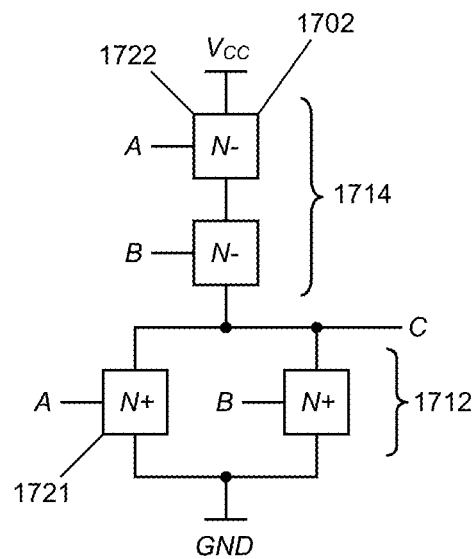
FIG. 17b shows the circuit diagram of a 2-input NOR gate constructed using only n-type enhancement-mode QWRTTs.

The NAND gate 1601 and the NOR gate 1602 can be implemented using only n-type QWRTTs by replacing the p-type enhancement-mode QWRTTs 1622 with n-type enhancement-mode QWRTTs with the same $V_{ON}$. FIG. 17a shows the circuit diagram of a 2-input NAND gate 1701, and FIG. 17b shows the circuit diagram of a 2-input NOR gate 1702. The pull-down network 1711 of the NAND gate 1701 and the pull-down network 1712 of the NOR gate 1702 are constructed using n-type enhancement-mode QWRTTs 1721 with positive $V_{ON}$. The pull-up network 1713 of the NAND gate 1701 and the pull-up network 1714 of the NOR gate 1702 are constructed using n-type enhancement-mode QWRTTs 1722 with negative $V_{ON}$.

All the QWRTT logic gates described above are called complementary QWRTT logic gates, which combine dual pull-down and pull-up networks. For dual networks, a parallel connection of transistors in the pull-down network corresponds to a series connection of the corresponding devices in the pull-up network, and vice versa. The pull-down network can produce "strong zeros" by pulling the output all the way down to GND, and the pull-up network can produce "strong ones" by charging the output all the way to the power supply voltage $V_{CC}$. When the pull-down network is constructed using normally on QWRTTs, the pull-up network is also constructed using normally on QWRTTs. The normally on QWRTTs used in the pull-down and pull-up networks can be n-type, p-type, or the combination of both types. When the pull-down network is constructed using enhancement-mode QWRTTs with positive $V_{ON}$, the pull-up network is constructed using enhancement-mode QWRTTs with negative $V_{ON}$. The enhancement-mode QWRTTs used in the pull-down and pull-up networks can be n-type, p-type, or the combination of both types. The pull-down and pull-up networks are mutually exclusive because one and only one of the networks is conducting in steady state. There is no static current between the power supply and GND, so the static power dissipation is zero. A path always exists between the output node and the power supply when the output is "one" or between the output node and GND when the output is "zero". The output node is always a low-impedance node in steady state. These circuits have good noise immunity because the output nodes exhibit full rail-to-rail swing.

Pass transistor logic is a popular and widely used alternative to complementary logic in CMOS digital circuit design. Pass transistor logic attempts to reduce the number of transistors by allowing the primary inputs to drive gate terminals as well as source/drain terminals. This is in contrast to complementary logic that only allows primary inputs to drive the gate terminals. Some specific circuits such as multiplexers and adders can be efficiently implemented using pass transistor logic with fewer transistors.

Figure 18A:
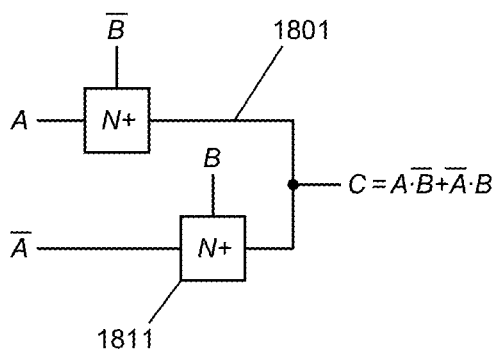
FIG. 18a shows the circuit diagram of an XOR gate implemented in pass transistor logic using n-type enhancement-mode QWRTTs with positive $V_{ON}$.
Figure 18B:
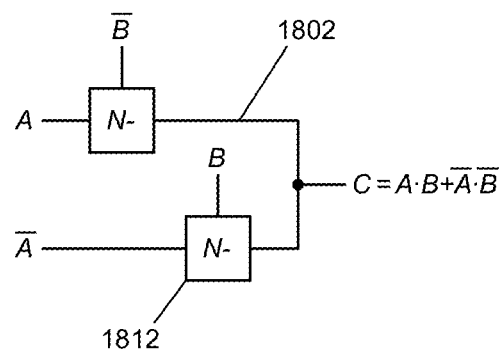
FIG. 18b shows the circuit diagram of an XNOR gate implemented in pass transistor logic using n-type enhancement-mode QWRTTs with negative $V_{ON}$.

Pass transistor logic can be efficiently implemented using QWRTTs as shown in the following examples of XOR and XNOR gates. FIG. 18a shows the circuit diagram of a 2-input XOR gate 1801, which is constructed using n-type enhancement-mode QWRTTs 1811 with positive $V_{ON}$. FIG. 18b shows the circuit diagram of a 2-input XNOR gate 1802, which is constructed using n-type enhancement-mode QWRTTs 1812 with negative $V_{ON}$. It can be seen that pass transistor logic uses fewer transistors than complementary logic that requires pull-down and pull-up networks. It is feasible that a pass transistor logic circuit is implemented using enhancement-mode QWRTTs with the combination of positive and negative $V_{ON}$.

The major drawback of pass transistor logic is the voltage drop of pass transistors. The most widely used solution is the use of transmission gates. A transmission gate in CMOS consists of an n-channel device in parallel with p-channel device. The transmission gate enables rail-to-rail swing by having the n-channel device to pull down and the p-channel device to pull up.

Figure 19A:
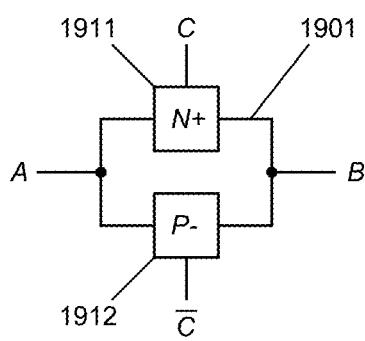
FIG. 19a shows the circuit diagram of a transmission gate constructed using both n- and p-type enhancement-mode QWRTTs.

A transmission gate can be implemented using QWRTTs. FIG. 19a shows the circuit diagram of a transmission gate 1901, which is constructed using an n-type enhancement-mode QWRTT 1911 with positive $V_{ON}$ and a p-type enhancement-mode QWRTT 1912 with negative $V_{ON}$. The transmission gate acts as a bilateral switch controlled by the control signal C and its complementary $\overline{C}$. When the control signal C is high, both devices 1911-1912 are on, which allows the input signal to pass through the gate. When the control signal C is low, both devices 1911-1912 are turned off, which creates an open circuit between the nodes A and B.

Figure 19B:
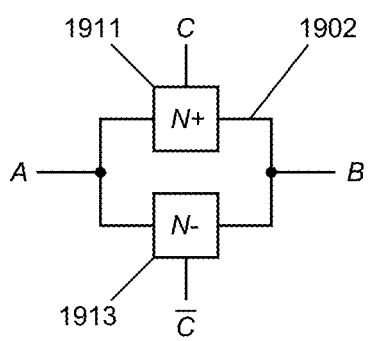
FIG. 19b shows the circuit diagram of a transmission gate constructed using only n-type enhancement-mode QWRTTs.

The transmission gate 1901 shown in FIG. 19a can be implemented using only n-type QWRTTs by replacing the p-type enhancement-mode QWRTT 1912 with an n-type enhancement-mode QWRTT with the same $V_{ON}$. FIG. 19b shows the circuit diagram of a transmission gate 1902, which is constructed using an n-type enhancement-mode QWRTT 1911 with positive $V_{ON}$ and an n-type enhancement-mode QWRTT 1913 with negative $V_{ON}$.

Memory is commonly built using the positive feedback of a bistable circuit. FIG. 20a shows the circuit schematic of a bistable circuit 2001, which is constructed with two cross-coupled inverters 2011-2012. The output of the second inverter 2012 is connected to the input of the first inverter 2011. The cross-coupled inverter pair results in a bistable circuit, which has two stable states that represent 0 and 1. In absence of any triggering, the circuit remains in a single state, and hence remembers a value. To change the state of the circuit, a trigger pulse overpowering the feedback loop is applied to the input D.

The bistable circuit 2001 shown in FIG. 20a can be implemented using QWRTTs as shown in FIGS. 20b and 20c for two different approaches. FIG. 20b shows the circuit diagram of a bistable circuit 2002, in which the inverters 2021-2022 have the same design as the QWRTT inverter 1401 as shown in FIG. 14a. FIG. 20c shows the circuit diagram of a bistable circuit 2003, in which the inverters 2031-2032 have the same design as the QWRTT inverter 1402 as shown in FIG. 14b. The bistable circuit 2002 shown in FIG. 20b is constructed using both n- and p-type QWRTTs, while the bistable circuit 2003 shown in FIG. 20c is constructed using only n-type QWRTTs.

A buffer and two inverters connected in cascade have the same logic function. Hence a buffer can be used to replace two cascaded inverters. FIG. 21a shows the circuit schematic of a bistable circuit 2101, which is constructed with a buffer 2111. The output of the buffer 2111 is connected to the input of the same buffer 2111 to create positive feedback and store a state. The bistable circuit 2101 can be implemented using QWRTTs as shown in FIGS. 21b and 21c for two different approaches. FIG. 21b shows the circuit diagram of a bistable circuit 2102, in which the buffer 2121 have the same design as the QWRTT buffer 1501 as shown in FIG. 15a. FIG. 21c shows the circuit diagram of a bistable circuit 2103, in which the buffer 2131 have the same design as the QWRTT buffer 1502 as shown in FIG. 15b. The bistable circuit 2102 shown in FIG. 21b is constructed using both n- and p-type QWRTTs, while the bistable circuit 2103 shown in FIG. 21c is constructed using only n-type QWRTTs.

Three memory elements (including latch, register, and SRAM cell) that use bistable circuits to store data are described below to illustrate that memory circuits can be efficiently implemented using QWRTTs. A bistable circuit is commonly constructed with two cross-coupled inverters. The logic function of two inverters connected in cascade is the same as that of a buffer. A buffer can replace two cascaded inverters, which results in significant reductions of transistor count (i.e., from four to two), area, propagation delay, and power consumption. The above benefits are not available to CMOS because a buffer is actually implemented as two inverters connected in cascade. These single-bit memory elements are fundamental building blocks of larger memory circuits such as latch arrays, shift registers, and SRAM. Memory circuits have occupied a large portion of chip area in today's microprocessors, and the trend is continuously increasing. Therefore, implementing memory circuits using QWRTTs has significant advantages over using CMOS devices.

Figure 22A:
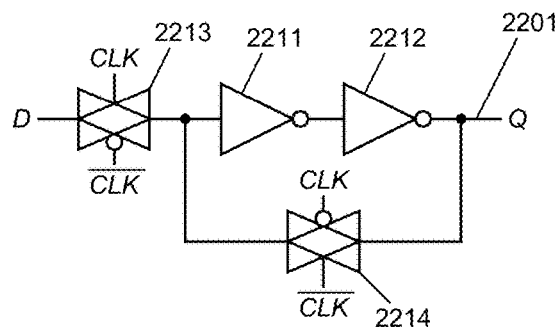
FIG. 22a shows the circuit schematic of a latch constructed with two inverters and two transmission gates.

A latch is a level-sensitive memory element. When a clock signal is high, the latch passes the input to the output, and the latch is in transparent mode. When a clock is low, the input data sampled on the falling edge of the clock is held stable at the output, and the latch is in hold mode. A latch operating under the above conditions is a positive latch. Similarly, a negative latch passes the input to the output when the clock is low. There are many different approaches for constructing latches. FIG. 22a shows the circuit schematic of a latch 2201, which is constructed with two inverters 2211-2212 and two transmission gates 2213-2214. When the clock CLK is high, the transmission gate 2213 is on. The input D passes through two cascaded inverters 2211-2212 to the output Q, and the latch is in transparent mode. During this phase, the transmission gate 2214 is off, and the feedback loop is open. The input signal does not have to overcome the feedback loop to write the memory, and hence transistor sizing is not critical for realizing correct functionality. When the clock CLK is low, the transmission gate 2213 is off, and the transmission gate 2214 is on. The feedback loop is enabled, and the latch in the hold mode.

Figure 22B:
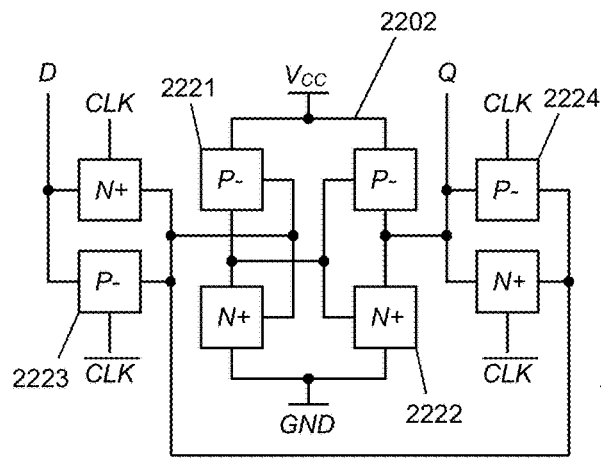
FIG. 22b shows the circuit diagram of the latch as shown in FIG. 22a constructed using both n- and p-type QWRTTs.
Figure 22C:
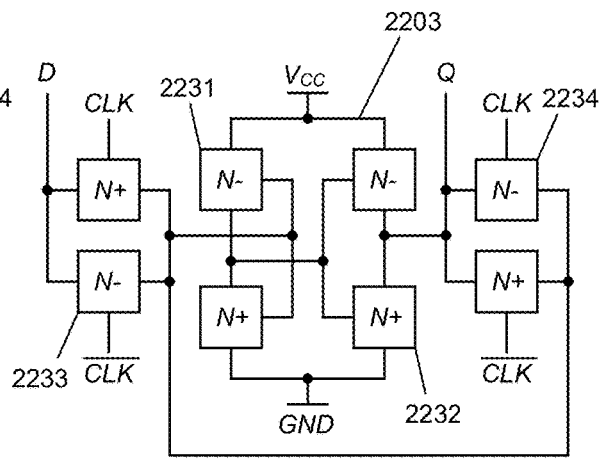
FIG. 22c shows the circuit diagram of the latch as shown in FIG. 22a constructed using only n-type QWRTTs.

The latch 2201 shown in FIG. 22a can be implemented using QWRTTs as shown in FIGS. 22b and 22c for two different approaches. FIG. 22b shows the circuit diagram of a latch 2202, which is constructed with two inverters 2221-2222 and two transmission gates 2223-2224. The two inverters 2221-2222 have the same design as the QWRTT inverter 1401 as shown in FIG. 14a. The two transmission gates 2223-2224 have the same design as the QWRTT transmission gate 1901 as shown in FIG. 19a. FIG. 22c shows the circuit diagram of a latch 2203, which is constructed with two inverters 2231-2232 and two transmission gates 2233-2234. The two inverters 2231-2232 have the same design as the QWRTT inverter 1402 as shown in FIG. 14b. The two transmission gates 2233-2234 have the same design as the QWRTT transmission gate 1902 as shown in FIG. 19b. The latch 2202 shown in FIG. 22b is constructed using both n- and p-type QWRTTs, while the latch 2203 shown in FIG. 22c is constructed using only n-type QWRTTs.

Figure 23A:
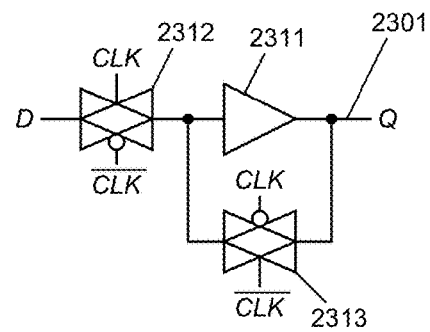
FIG. 23a shows the circuit schematic of a latch constructed with a buffer and two transmission gates.
Figure 23B:
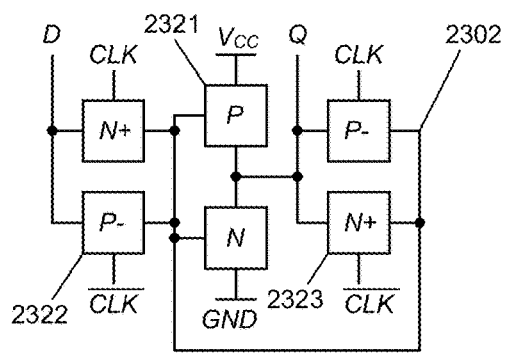
FIG. 23b shows the circuit diagram of the latch as shown in FIG. 23a constructed using both n- and p-type QWRTTs.
Figure 23C:
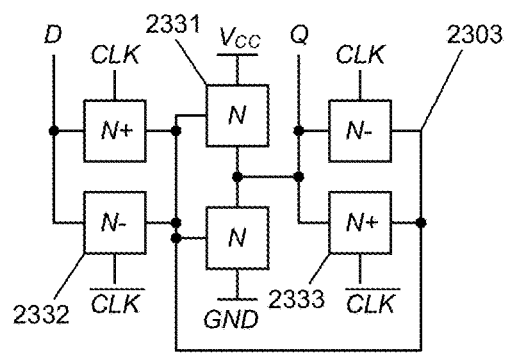
FIG. 23c shows the circuit diagram of the latch as shown in FIG. 23a constructed using only n-type QWRTTs.

As described earlier, two cascaded inverters can be replaced with a buffer. FIG. 23a shows the circuit schematic of a latch 2301, which is constructed with a buffer 2311 and two transmission gates 2312-2313. The latch 2301 shown in FIG. 23a can be implemented using QWRTTs as shown in FIGS. 23b and 23c for two different approaches. FIG. 23b shows the circuit diagram of a latch 2302 constructed with a buffer 2321 and two transmission gates 2322-2323. The buffer 2321 has the same design as the QWRTT buffer 1501 as shown in FIG. 15a. The two transmission gates 2322-2323 have the same design as the QWRTT transmission gate 1901 as shown in FIG. 19a. FIG. 23c shows the circuit diagram of a latch 2303 constructed with a buffer 2331 and two transmission gates 2332-2333. The buffer 2331 has the same design as the QWRTT buffer 1502 as shown in FIG. 15b. The two transmission gates 2332-2333 have the same design as the QWRTT transmission gate 1902 as shown in FIG. 19b. The latch 2302 shown in FIG. 23b is constructed using both n- and p-type QWRTTs, while the latch 2303 shown in FIG. 23c is constructed using only n-type QWRTTs.

A register (also called a flip-flop) is an edge triggered memory element, which only sample the input on a clock transition, e.g., a rising trigger edge for a positive edge-triggered register, and a falling trigger edge for a negative edge-triggered register. The output is then held stable until the next clock transition. The most common approach for constructing a register is to use a master-slave configuration. A positive edge-triggered register consists of a negative latch (master stage) cascading with a positive latch (slave stage). A negative edge-triggered register can be constructed using the same principle by simply switching the order of the positive and negative latches. Since a latch can be implemented using QWRTTs, so as a register.

Figure 24A:
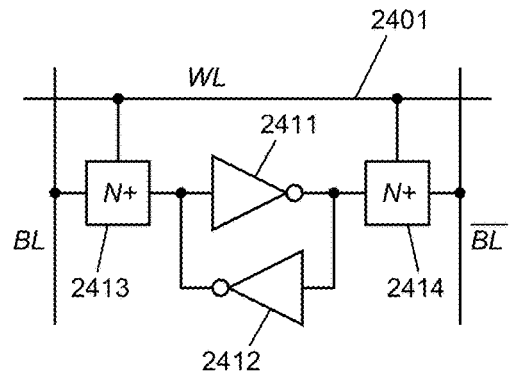
FIG. 24a shows a 6T SRAM cell constructed with two cross-coupled inverters and two access transistors.

The fundamental building block in an SRAM (Static Random-Access Memory) array is the SRAM cell that stores a single bit of data. The most commonly used SRAM bit cell architecture is the six-transistor (6T) SRAM cell. FIG. 24a shows a 6T SRAM cell 2401, which comprises two cross-coupled inverters 2411-2412 and two access transistors 2413-2414. The SRAM cell incorporates a bistable circuit, so it does not require periodic refresh like DRAM (Dynamic Random-Access Memory) to retain its stored information. It can hold its state as long as power is supplied. The two access transistors 2413-2414 allow bi-directional flow of current between the bit lines (BL and $\overline{BL}$) and the cell. The access transistors 2413-2414 are activated/deactivated using the word line WL to control the access of bit cell during read and write operations.

SRAM has three modes of operation: hold, read, and write. In a hold mode, the word line is not asserted, and the access transistors disconnect the cell from the bit lines. In a read operation, both the bit lines are pre-charged to high voltage. The word line is then driven high to enable the access transistors. One of the bit lines will be pulled down by the cell, and a small voltage difference is developed between the two bit lines. A sense amplifier is activated and captures the value on bit lines. In a write operation, column driver circuit on periphery differentially drives the bit lines. The word line is then driven high to enable the access transistors. The bit lines overwrite the logic state in a cell. To ensure proper operation, all the transistors in an SRAM cell must be carefully sized, so that the stored value will not be destroyed in a read operation and the bit-line voltages can override the previous state of the bit cell in a write operation.

Figure 24B:
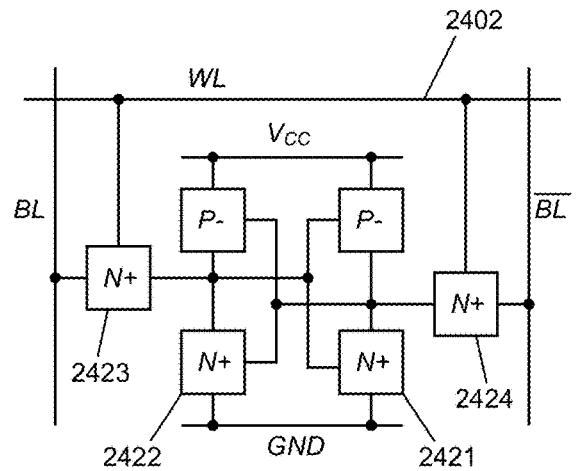
FIG. 24b shows the circuit diagram of the 6T SRAM cell as shown in FIG. 24a constructed using both n- and p-type QWRTTs.
Figure 24C:
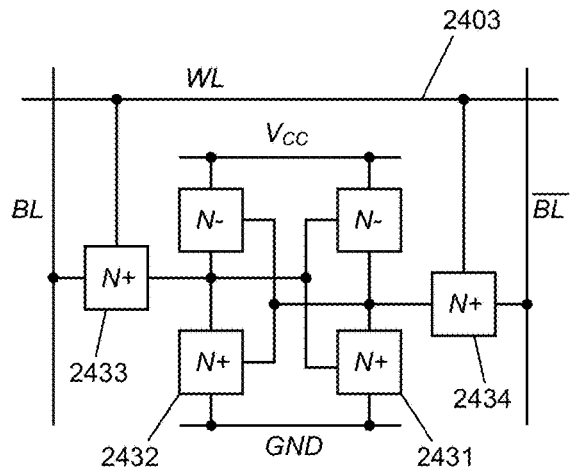
FIG. 24c shows the circuit diagram of the 6T SRAM cell as shown in FIG. 24a constructed using only n-type QWRTTs.

The SRAM cell 2401 shown in FIG. 24*a* can be implemented using QWRTTs as shown in FIGS. 24*b* and 24*c* for two different approaches. FIG. 24*b* shows the circuit diagram of a 6T SRAM cell 2402, which comprises two cross-coupled inverters 2421-2422 and two access transistors 2423-2424. The two inverters 2421-2422 have the same design as the QWRTT inverter 1401 as shown in FIG. 14*a*. FIG. 24*c* shows the circuit diagram of a 6T SRAM cell 2403, which comprises two cross-coupled inverters 2431-2432 and two access transistors 2433-2434. The two inverters 2431-2432 have the same design as the QWRTT inverter 1402 as shown in FIG. 14*b*. The SRAM cell 2402 shown in FIG. 24*b* is constructed using both n- and p-type QWRTTs, while the SRAM cell 2403 shown in FIG. 24*c* is constructed using only n-type QWRTTs.

Figure 25A:
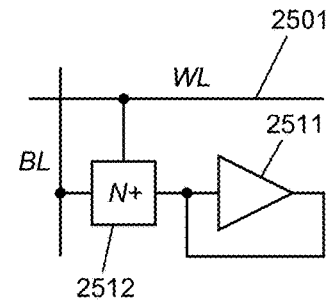
FIG. 25a shows a single-ended 3T SRAM cell constructed with a buffer and an access transistor.

As described earlier, two cascaded inverters can be replaced with a buffer. FIG. 25*a* shows a single-ended three-transistor (3T) SRAM cell 2501, which comprises a buffer 2511 and an access transistor 2512. The output of the buffer 2511 is connected to the input of the same buffer 2511 to create positive feedback and store a state. The 3T SRAM cell 2501 in FIG. 25*a* occupies smaller area and requires few transistors than the 6T SRAM cell 2401 in FIG. 24*a*. The memory bit lines usually have a heavy capacitive loading. Switching the heavy bit lines costs significant power consumption in read and write operations. The single-ended design minimizes the number of bit lines. The power consumption can be reduced because the 3T SRAM cell 2501 uses less numbers of transistors and bit lines than the conventional 6T SRAM cell.

Figure 25B:
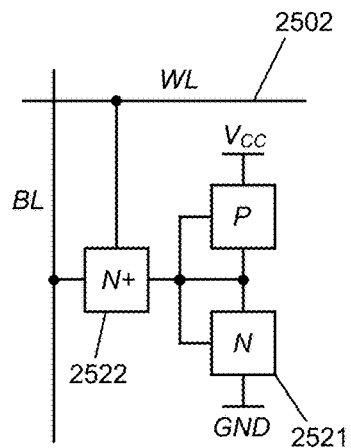
FIG. 25b shows the circuit diagram of the 3T SRAM cell as shown in FIG. 25a constructed using both n- and p-type QWRTTs.
Figure 25C:
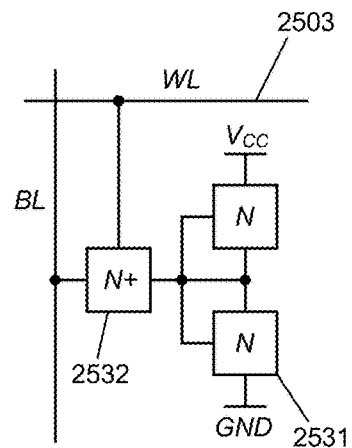
FIG. 25c shows the circuit diagram of the 3T SRAM cell as shown in FIG. 25a constructed using only n-type QWRTTs.

The SRAM cell 2501 shown in FIG. 25*a* can be implemented using QWRTTs as shown in FIGS. 25*b* and 25*c* for two different approaches. FIG. 25*b* shows the circuit diagram of a 3T SRAM cell 2502, which comprises a buffer 2521 and an access transistor 2522. The buffer 2521 has the same design as the QWRTT buffer 1501 as shown in FIG. 15*a*. FIG. 25*c* shows the circuit diagram of a 3T SRAM cell 2503, which comprises a buffer 2531 and an access transistor 2532. The buffer 2531 has the same design as the QWRTT buffer 1502 as shown in FIG. 15*b*. The SRAM cell 2502 shown in FIG. 25*b* is constructed using both n- and p-type QWRTTs, while the SRAM cell 2503 shown in FIG. 25*c* is constructed using only n-type QWRTTs.

The access transistors shown in FIG. 24*a* and FIG. 25*a* are n-type enhancement-mode QWRTTs with positive $V_{ON}$. As described before in the pass transistor logic section, enhancement-mode QWRTTs with negative $V_{ON}$ can also be used as access transistors. When access transistors have negative $V_{ON}$, WL voltage is high to disable access transistors in a hold mode, and WL voltage is low to enable access transistors in read and write operations.

What is claimed is:

1. A digital circuit, comprising:
   one or more quantum wire resonant tunneling transistors (QWRTTs), wherein at least one of the QWRTTs comprises:
      an emitter terminal;
      a base terminal;
      a collector terminal;
      an emitter region in connection with the emitter terminal;
      a base region in connection with the base terminal;
      a collector region in connection with the collector terminal, wherein at least one of the emitter region, the base region, and the collector region comprises a plurality of metal quantum wires;
      an emitter barrier region between the emitter region and the base region; and
      a collector barrier region between the collector region and the base region.

2. The digital circuit of claim 1, further comprising:
   a complementary logic gate comprising:
      an input node;
      an output node;
      a pull-down network comprising the one or more QWRTTs; and
      a pull-up network comprising the one or more QWRTTs,
      wherein the pull-down network and the pull-up network form dual networks, in which a parallel connection of the one or more QWRTTs in the pull-down network corresponds to a series connection of the one or more QWRTTs in the pull-up network, or in which a series connection of the one or more QWRTTs in the pull-down network corresponds to a parallel connection of the one or more QWRTTs in the pull-up network.

3. The digital circuit of claim 2, wherein the input node of the complementary logic gate is connected to the base terminal of one of the one or more QWRTTs in the pull-down network,
   wherein the input node of the complementary logic gate is connected to the base terminal of one of the one or more QWRTTs in the pull-up network.

4. The digital circuit of claim 2, wherein the pull-down network of the complementary logic gate comprises one or more enhancement-mode QWRTTs with positive on-voltage $V_{ON}$,
   wherein the pull-up network of the complementary logic gate comprises one or more enhancement-mode QWRTTs with negative $V_{ON}$.

5. The digital circuit of claim 2, wherein the pull-down network of the complementary logic gate comprises one or more normally on QWRTTs,
   wherein the pull-up network of the complementary logic gate comprises one or more normally on QWRTTs.

6. The digital circuit of claim 2, wherein the pull-down network of the complementary logic gate comprises one or more n-type QWRTTs,
   wherein the pull-up network of the complementary logic gate comprises one or more n-type QWRTTs.

7. The digital circuit of claim 2, wherein the complementary logic gate includes an AND gate, an OR gate, a NOT gates, a buffer, a NAND gate, a NOR gate, or a combination thereof.

8. The digital circuit of claim 1, further comprising:
a pass transistor logic gate comprising:
one or more enhancement-mode QWRTTs having positive $V_{ON}$,
one or more enhancement-mode QWRTTs having negative $V_{ON}$, or
a combination thereof.

9. The digital circuit of claim 1, further comprising:
a memory element comprising a bistable circuit to store a bit of data, wherein the bistable circuit includes the one or more QWRTTs.

10. The digital circuit of claim 9, wherein the bistable circuit comprises two inverters or a buffer.

11. The digital circuit of claim 9, wherein the memory element is characterized by a six-transistor (6T) SRAM cell comprising:
two cross-coupled inverters formed by four enhancement-mode QWRTTs;
two access transistors formed by two enhancement-mode QWRTTs;
a word line; and
two bit lines,
wherein the word line and the two bit lines are configured to address the SRAM cell and to access stored data in read and write operations.

12. The digital circuit of claim 9, wherein the memory element is characterized by a three-transistor (3T) SRAM cell comprising:
a buffer formed by two normally on QWRTTs;
an access transistor formed by an enhancement-mode QWRTT;
a word line; and
a bit line,
wherein the word line and the bit line are configured to address the SRAM cell and to access stored data in read and write operations.

13. The digital circuit of claim 1, wherein the one or more QWRTTs include n-type devices and p-type devices,
wherein the n-type devices and the p-type devices are configured as normally on transistors with $V_{ON}=0$ V, enhancement-mode transistors with positive $V_{ON}$, or enhancement-mode transistors with negative $V_{ON}$.

14. The digital circuit of claim 13, wherein the enhancement-mode QWRTTs have multiple $V_{ON}$ values, wherein the enhancement-mode QWRTTs are configured to operate at multiple power supply voltages.

15. The digital circuit of claim 1, wherein the plurality of metal quantum wires are formed by implantation of metal ions into the open channels of a crystalline semiconductor,
wherein a mask layer used in the ion implantation is aligned to the lattice structure on a wafer surface.

* * * * *